(12) United States Patent
Tatsuno et al.

(10) Patent No.: US 8,670,472 B2
(45) Date of Patent: Mar. 11, 2014

(54) OPTICAL SCANNING DEVICE AND IMAGE FORMING APPARATUS

(75) Inventors: Hibiki Tatsuno, Kanagawa (JP); Daisuke Ichii, Kanagawa (JP)

(73) Assignee: Ricoh Company, Limited, Tokyo (JP)

( * ) Notice: Subject to any disclaimer, the term of this patent is extended or adjusted under 35 U.S.C. 154(b) by 236 days.

(21) Appl. No.: 12/698,522

(22) Filed: Feb. 2, 2010

(65) Prior Publication Data
US 2010/0195681 A1    Aug. 5, 2010

(30) Foreign Application Priority Data

Feb. 2, 2009 (JP) ................................. 2009-021371
Dec. 22, 2009 (JP) ................................. 2009-290704

(51) Int. Cl.
*H01S 3/10* (2006.01)
(52) U.S. Cl.
USPC ............... 372/24; 372/50.124; 359/201.1; 359/206.1; 359/216.1
(58) Field of Classification Search
USPC ................................................. 372/24
See application file for complete search history.

(56) References Cited

U.S. PATENT DOCUMENTS

| 3,913,033 | A | * | 10/1975 | Tuccio et al. ................ 372/53 |
| 4,310,757 | A | * | 1/1982 | Check et al. ................ 250/236 |
| 5,018,833 | A | * | 5/1991 | Bennett et al. ............... 359/888 |
| 5,034,950 | A | * | 7/1991 | Jackel et al. ................ 372/21 |
| 5,111,468 | A | * | 5/1992 | Kozlovsky et al. .......... 372/32 |
| 5,126,873 | A | * | 6/1992 | Ang ........................ 359/217.1 |
| 6,882,673 | B1 | * | 4/2005 | Wasserbauer et al. ...... 372/50.1 |
| 6,924,938 | B2 | | 8/2005 | Nishina et al. |
| 7,218,432 | B2 | | 5/2007 | Ichii et al. |
| 7,417,777 | B2 | | 8/2008 | Saisho et al. |
| 7,443,558 | B2 | | 10/2008 | Sakai et al. |
| 7,545,547 | B2 | | 6/2009 | Hayashi et al. |
| 7,586,661 | B2 | | 9/2009 | Ichii |
| 7,623,280 | B2 | | 11/2009 | Hirakawa et al. |
| 7,626,744 | B2 | | 12/2009 | Arai et al. |
| 7,663,657 | B2 | | 2/2010 | Ichii et al. |
| 2001/0050797 | A1 | * | 12/2001 | Toyoda et al. ................ 359/205 |

(Continued)

FOREIGN PATENT DOCUMENTS

JP    5-160467 A    6/1993
JP    9-243945 A    9/1997

(Continued)

OTHER PUBLICATIONS

Yasuhara Suematsu, et al., "Photonics", Dec. 2007 pp. 240-251 with English Translation pp. 1-18.

*Primary Examiner* — Xinning Niu
(74) *Attorney, Agent, or Firm* — Dickstein Shapiro LLP

(57) ABSTRACT

An optical scanning device includes a vertical-cavity surface-emitting laser light source that emits laser beams perpendicular to a top surface thereof; a first optical system that couples the beams from the light source; a deflecting unit that deflects the beams; a second optical system that guides the beams from the first optical system to the deflecting unit; a third optical system that focuses the beams deflected by the deflecting unit into an optical spot on a scanned surface; and a light-quantity adjusting element disposed between the light source and the deflecting unit and having a substrate formed of a first and second surfaces. The first surface of the light-quantity adjusting element is coated with neutral density coating and the second surface is coated with antireflection coating so that reflectance of the second surface is made smaller than reflectance of the first surface.

10 Claims, 16 Drawing Sheets

(56) References Cited

U.S. PATENT DOCUMENTS

| | | |
|---|---|---|
| 2002/0191310 A1* | 12/2002 | Weigl et al. .................... 359/885 |
| 2003/0210445 A1* | 11/2003 | Mori ............................. 359/204 |
| 2004/0202210 A1* | 10/2004 | Thornton ........................ 372/34 |
| 2007/0211325 A1 | 9/2007 | Ichii |
| 2007/0242350 A1 | 10/2007 | Endo |
| 2007/0253047 A1 | 11/2007 | Ichii et al. |
| 2007/0253048 A1 | 11/2007 | Sakai et al. |
| 2008/0024849 A1 | 1/2008 | Hayashi et al. |
| 2008/0025759 A1 | 1/2008 | Ichii et al. |
| 2008/0055672 A1 | 3/2008 | Watanabe et al. |
| 2008/0068690 A1 | 3/2008 | Ichii |
| 2008/0068693 A1 | 3/2008 | Hayashi et al. |
| 2008/0123159 A1 | 5/2008 | Hayashi et al. |
| 2008/0192319 A1 | 8/2008 | Miyatake et al. |
| 2008/0212999 A1 | 9/2008 | Masuda et al. |
| 2008/0267663 A1 | 10/2008 | Ichii et al. |
| 2009/0060582 A1 | 3/2009 | Ichii et al. |
| 2009/0065685 A1 | 3/2009 | Watanabe et al. |
| 2009/0175657 A1 | 7/2009 | Yoshii et al. |
| 2009/0195849 A1 | 8/2009 | Ichii et al. |
| 2009/0295900 A1 | 12/2009 | Ichii |
| 2009/0314927 A1 | 12/2009 | Tatsuno et al. |
| 2009/0315967 A1 | 12/2009 | Hayashi et al. |

FOREIGN PATENT DOCUMENTS

| | | |
|---|---|---|
| JP | 3227226 A | 8/2001 |
| JP | 3243013 B2 | 10/2001 |
| JP | 3518765 B2 | 2/2004 |
| JP | 2005-19881 A | 1/2005 |
| JP | 2005-215188 A | 8/2005 |
| JP | 2006-41181 A | 2/2006 |
| JP | 2006-154104 A | 6/2006 |
| JP | 2008-12690 A | 1/2008 |
| JP | 2008-33062 A | 2/2008 |
| JP | 2008-52247 A | 3/2008 |
| JP | 2008-224943 A | 9/2008 |
| WO | WO 2009/011290 A1 | 1/2009 |

* cited by examiner

CONSTRUCTIVE CONDITION FOR TRANSMITTED LIGHT: ... (1)
$n(BC+CD)-BE=2nd \cdot \cos\theta = m\lambda$ (M IS INTEGER)

DESTRUCTIVE CONDITION FOR TRANSMITTED LIGHT: ... (2)
$n(BC+CD)-BE=2nd \cdot \cos\theta = (m+1/2)\lambda$

DFB LASER (TRANSMITTED LIGHT QUANTITY It)=(ELECTRIC FIELD Et)$^2$=[(1)+(2)]$^2$ (TRANSMITTED LIGHT QUANTITY It)=(ELECTRIC FIELD Et)²=[(1)+(2)+(3)+···]²

OPTICAL SCANNING DEVICE AND IMAGE FORMING APPARATUS

CROSS-REFERENCE TO RELATED APPLICATIONS

The present application claims priority to and incorporates by reference the entire contents of Japanese Patent Application No. 2009-21371 filed in Japan on Feb. 2, 2009 and Japanese Patent Application No. 2009-290704 filed in Japan on Dec. 22, 2009.

BACKGROUND OF THE INVENTION

1. Field of the Invention

The present invention relates to an optical scanning device, an image forming apparatus, and an optical communication system. In particular, the present invention relates to an optical scanning device including a vertical-cavity surface-emitting laser as a light source and used in an image forming apparatus such as a copier, a printer, a facsimile, a plotter, or a multifunction peripheral having a plurality of these functions; and an image forming apparatus and an optical communication system having the optical scanning device.

2. Description of the Related Art

In recent years, high-speed, high-density, and high-image-quality image forming apparatuses have been demanded. To meet the demand, an image forming apparatus using a multibeam writing system provided with a plurality of light-emitting points to scan a single scanned surface with a plurality of beams has been put to practical use.

Optical scanning devices, in particular, laser scanning devices using semiconductor lasers have been widely applied to image forming apparatuses such as image display devices or image recording devices because the laser scanning devices have simple structures, high-speed performance, and high resolution capability. The laser scanning devices are especially suitable as exposure devices of electrophotographic printers, and a large number of products as laser beam printers have been put in the market.

Furthermore, in more recent years, a demand for higher-speed and higher-resolution image forming apparatuses are expanding, and increase in scanning speed is also being desired. To realize the high-speed scanning, a high-speed deflecting device is necessary. However, if a rotating polygon mirror for example is used as the deflecting device, increase in the number of rotations may be limited.

As one countermeasure against the limited number of rotations, as disclosed in Japanese Patent No. 3227226 for example, there has been proposed an image forming apparatus having a so-called multibeam scanning device that performs scanning with beams from a vertical cavity surface emitting laser (VCSEL), which is a surface emitting laser having a plurality of independently-modulatable light-emitting points, to scan a plurality of scanning lines simultaneously by one scanning.

An example of a conventional optical scanning device that includes a VCSEL having the above-mentioned plurality of light-emitting areas is illustrated in FIG. 15. In FIG. 15, a plurality of laser beams are emitted from a light source 101 having the plurality of light-emitting areas and a light-emitting control unit for controlling the light-emitting points, and collimated and shaped by a coupling optical system including a coupling lens 102, an aperture 104, and a cylindrical lens 103. The plurality of laser beams are, after being coupled, deflected and reflected by a deflector 105 serving as a deflecting unit formed of a rotating polygon mirror, and then are made to scan in a main-scanning direction. Furthermore, a first scanning lens 106a and a second scanning lens 106b constituting a scanning imaging optical system focus the plurality of laser beams onto a scanned surface (photosensitive element) 108 serving as an imaging plane, i.e., a cylindrical image carrier bearing a photosensitive medium in the present example, to form a scanning line 109. In FIG. 15, 107a, 107b, and 107c respectively denote a first, a second, and a third reflecting mirrors that reflect the laser beams passed through the second scanning lens 106b.

The image carrier is rotated about an axis of the cylinder illustrated in FIG. 15 to move the imaging plane in a direction perpendicular to the main-scanning direction to enable optical scanning and image formation.

To realize high-speed image output, it is possible to apply means for utilizing multibeam by the above-mentioned VCSEL for example. In particular, a high-speed output device is generally provided with a writing light source utilizing multibeam.

Furthermore, in relation to the problems to be solved by the present invention, which will be described later, Japanese Patent Application Laid-open No. 2008-33062 discloses a cylindrical lens whose surface on a light source side is coated with light-quantity attenuation coating so that, when an fθ lens without antireflection film is used to focus a light beam emitted from the light source onto a photosensitive element through the fθ lens, occurrence of return light (reflected light) from the fθ lens to the light source can be prevented.

Japanese Patent No. 3243013 discloses an optical scanning device having a shading correction function, in which coating made of an oxide having birefringence property is applied onto a flat lens surface on a light input side of a flat-convex cylinder lens, which has the flat surface on a light source side, or onto a lens surface on a light output side of a collimating lens, which shapes a laser beam from the light source into a parallel beam, to transform linear polarized light into practically circular polarized light.

Japanese Patent Application Laid-open No. H05-160467 discloses using a parallel plate as an optical element such that a part of a light beam emitted from a single-mode semiconductor laser is reflected multiple times between a plurality of planes and then is caused to pass and to be transmitted through the parallel plate together with a residual light beam, and also discloses that mode hopping of the semiconductor laser is detected based on multiple interference that occurs in the parallel plate.

However, because mass production results of the VCSEL light source are smaller than those of an edge emitting laser diode (LD), the VCSEL light source has a problem in that its current light quantity (light output) range is narrower than that of the edge emitting LD.

A light source mounted on the optical scanning device needs to ensure a light output range wider than a certain range because of the first to the third reasons described below.

[First Reason]

Light emitted from the light source mounted on the optical scanning device reaches a photosensitive element via a first optics (hereinafter, also referred to as "the first optical system"), a second optics (hereinafter, also referred to as "the second optical system"), a rotating polygon mirror, and a third optics (hereinafter, also referred to as "the third optical system"). When optical elements of the optical systems are mass produced, each optical element may have different transmittance and reflectance. Consequently, a ratio between optical energy output from the light source and optical energy input to the photosensitive element, i.e., light use efficiency, may vary depending on optical scanning devices. Therefore, if constant optical energy is desired on a photosensitive element in each image forming apparatus, the light output energy from the light source needs to be adjusted.

[Second Reason]

In addition to the variation described in the first reason, variation in shading characteristics due to variation in the rotating polygon mirror and the third optical system also needs to be considered. Herein, the shading characteristics is a light quantity ratio between light quantity at the center of the photosensitive element and light quantity at a periphery of the photosensitive element other than the center in light quantity distribution in the main-scanning direction.

To correct the shading characteristics, i.e., to equalize the light quantity between the center and the periphery of the photosensitive element in the main scanning direction, as illustrated in FIG. 16, light quantity of the periphery is reduced when the light quantity of the periphery is larger than that of the center in the main scanning direction, and, the light quantity of the periphery is increased when the light quantity of the periphery is smaller than that of the center in the main-scanning direction. Accordingly, as illustrated in FIG. 17, the light quantity on the photosensitive element is made constant between the center and the periphery in the main scanning direction after the shading correction is performed, and desired light quantity is acquired. It is of course possible to increase the light quantity of the center in the main-scanning direction depending on the light quantity of the periphery. However, the above method is described only by way of example of the shading correction, and other methods are not described herein.

To perform the shading correction, it is necessary to adjust the light output energy from the light source to increase or decrease the light quantity of the periphery.

That is, as illustrated in FIG. 18, it is necessary to widen the light output range of the light source in accordance with the variation in the light use efficiency of the center of the photosensitive element and the variation in the light use efficiency of the periphery of the photosensitive element.

[Third Reason]

The optical energy from the light source in the assembled image forming apparatus is adjusted in accordance with the variation in the light use efficiencies of the photosensitive element and the optical scanning device because of the first and the second reasons. However, when the image forming apparatus is operated for a long period of time, desired optical energy quantity may be changed because of degradation of the photosensitive element or change in surrounding conditions. Therefore, the light source also needs to cope with such temporal changes.

A method that may save a situation where the light source does not satisfy the light output range desired in the first to the third reasons has been proposed. Specifically, the method is to reduce the variation in the light use efficiency between the optical scanning devices by using a neutral density filter (hereinafter, referred to as "ND filter"). In the method, when four optical scanning devices for example have different light use efficiencies of 1.05, 1.03, 1.00, and 0.97, respectively, if ND filters with transmittance of 1/1.05 and 1/1.03 are applied onto the optical scanning devices having the light use efficiencies of over 1.00, the variation in the light use efficiency can be reduced from a range from 0.97 to 1.05 to a range from 0.97 to 1.00.

As described above, the ND filter serves as effective means for reducing the variation in the light use efficiency of the writing optical system to compensate for the inadequacy of the light output range of the VCSEL light source. However, the ND filter is incompatible with the VCSEL light source, and causes the following problems.

That is, because a glass plate or a plastic plate is generally used as a substrate of the ND filter, when, for example, an ND filter having a first surface (hereinafter, also referred to as "a first plane") and a second surface (hereinafter, also referred to as "a second plane") that are flat glass plates parallel to each other is placed between a coupling lens and a cylindrical lens of the conventional optical scanning device as illustrated in FIG. 15, and if emission light from the coupling lens is a parallel beam (emission light from a coupling lens is usually a parallel beam in typical optical scanning devices), the parallel beam input to an ND filter 200 causes multiple reflection and multiple interference in the glass substrate having a refractive index n.

In Equations (1) and (2) described in FIG. 19, d represents a thickness of the substrate, $\theta$ represents a refracting angle, $\lambda$ represents a wavelength of laser light, and an n(BC+CD)-BE represents an optical path difference between adjacent transmitted lights.

The VCSEL has an oscillation spectrum at a more preferable single wavelength than that of an edge emitting type LD (see, for example, "Photonics", Ohmsha, Ltd., issued in December, 2007). However, the wavelength may be changed slightly in a range smaller than 1 nm as input current to the VCSEL is increased. If the wavelength is slightly changed, a phase of light emitted from each ND filter is changed, so that level of construction or destruction of multiply-reflected lights is changed. Therefore, linear-function-like linearity of the light intensity of the emission light from the ND filter is not maintained against the input current.

This phenomenon is described with reference to FIG. 19. If the wavelength $\lambda$ is slightly changed due to the input current, the refractive index n and the refracting angle $\theta$ of the ND filter 200 are slightly changed, so that the level of construction or destruction of the transmitted light is changed.

As described above, regarding the technology related to the conventional optical scanning device, the following problems are not suggested and described in documents or literatures including the above-mentioned patent documents or non-patent literature to the best knowledge of the inventors of the present invention. That is, when the light output range is not ensured because of the above-mentioned first to third reasons, and if the ND filter is arranged for adjusting and reducing the variation in the light use efficiency between the optical scanning devices, light intensity on the photosensitive element is changed according to the input current to the VCSEL because the multiple interference of the laser beam from the VCSEL occurs in the ND filter.

SUMMARY OF THE INVENTION

It is an object of the present invention to at least partially solve the problems in the conventional technology.

According to an aspect of the present invention, there is provided an optical scanning device includes a vertical-cavity surface-emitting laser light source that emits laser beams perpendicular to a top surface thereof; a first optical system that couples the laser beams from the light source; a deflecting unit that deflects the laser beams; a second optical system that guides the laser beams from the first optical system to the deflecting unit; a third optical system that focuses the laser beams deflected by the deflecting unit into an optical spot on a scanned surface; and a light-quantity adjusting element disposed between the light source and the deflecting unit and having a substrate formed of a first surface and a second surface. The first surface of the light-quantity adjusting element is coated with neutral density coating and the second surface of the light-quantity adjusting element is coated with antireflection coating so that reflectance of the second surface is made smaller than reflectance of the first surface.

According to another aspect of the present invention, there is provided an optical scanning device includes a vertical-cavity surface-emitting laser light source that emits laser beams perpendicular to a top surface thereof; a first optical system that couples the laser beams from the light source; a beam limiting element that limits a thickness of the laser beams; a deflecting unit that deflects the laser beams; a second optical system that guides the laser beams from the first optical system to the deflecting unit; and a third optical system that focuses the laser beams deflected by the deflecting unit into an optical spot on a scanned surface. The second optical system includes a cylindrical lens having a curved surface coated with neutral density coating.

According to still another aspect of the present invention, there is provided an optical scanning device includes a vertical-cavity surface-emitting laser light source that emits laser beams perpendicular to a top surface thereof; a first optical system that couples the laser beams from the light source; a beam limiting element that limits a thickness of the laser beams; a deflecting unit that deflects the laser beams; a second optical system that guides the laser beams from the first optical system to the deflecting unit; and a shading member that is disposed between the light source and the deflecting unit and blocks a part of the laser beam passed through the beam limiting element.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments (hereinafter, referred to as "embodiments") including examples of the present invention will be explained in detail below with reference to the accompanying drawings. In the embodiments, modified examples, and the like, constituent elements (members and components) having the same functions and the same shapes are denoted by the same symbols when they are not confusable.

First Embodiment

Figure 1:
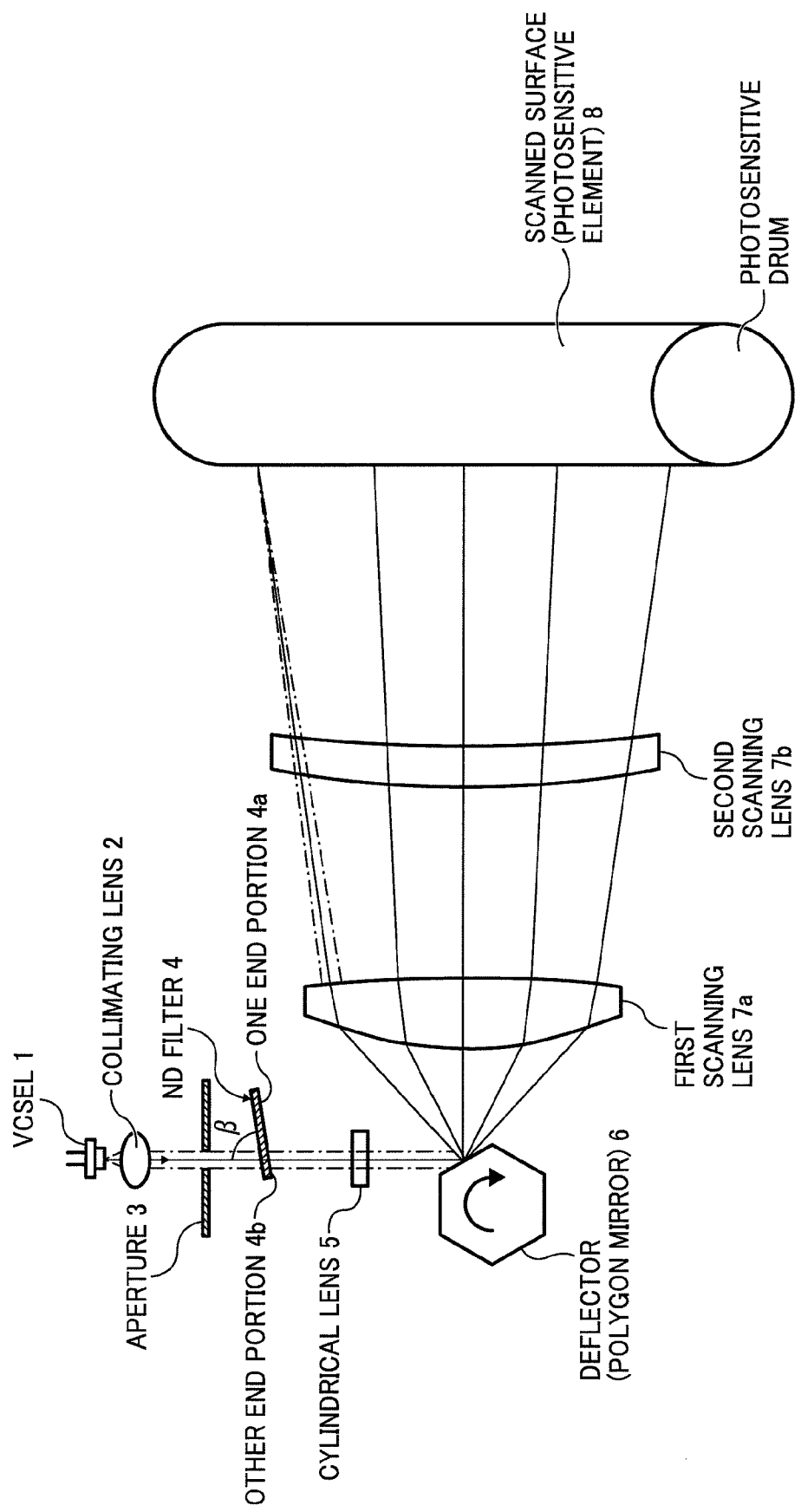
FIG. 1 is a diagram of an entire configuration of an optical system of an optical scanning device according to a first embodiment of the present invention.
Figure 2:
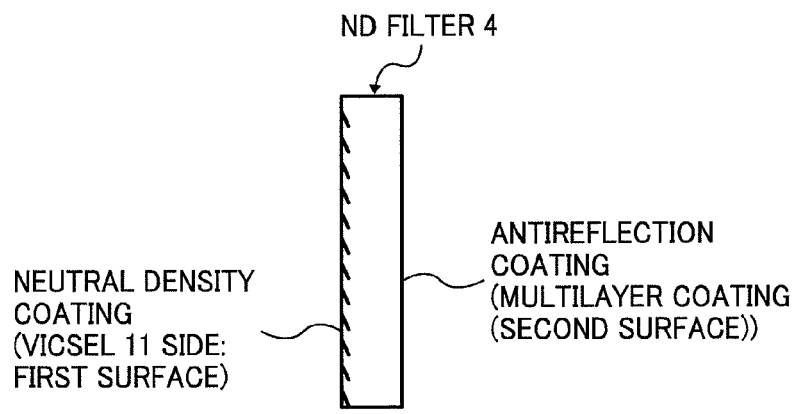
FIG. 2 is a diagram of a configuration of an ND filter used in the optical scanning device according to the first embodiment.

With reference to FIGS. 1 and 2, an optical scanning device according to a first embodiment of the present invention will be described. FIG. 1 is a diagram of an entire configuration of an optical system of the optical scanning device according to the first embodiment.

As illustrated in FIG. 1, the optical scanning device according to the first embodiment mainly includes a vertical-cavity surface-emitting laser (VCSEL) 1 having a plurality of light-emitting points; a coupling lens 2 serving as a first optical system that couples laser light beams (hereinafter, referred to as "laser beam" or simply referred to as "beam") emitted from the VCSEL 1; an aperture 3 serving as a beam limiting element that limits a thickness of the collimated beams emitted from the coupling lens 2; an ND filter 4 disposed between the VCSEL 1 and a deflector 6 and serving as a light-quantity adjusting element that adjusts light use efficiency of the optical scanning device; a cylindrical lens 5 serving as a second optical system that focuses the beams limited by the aperture 3 and transmitted through the cylindrical lens 5 into a line extending in a main-scanning direction; the deflector 6 that includes a rotating polygon mirror (hereinafter, also referred to as "polygon mirror") having a deflecting reflecting surface near the linear focused portion of the beams and that serves as a deflecting unit for deflecting the beam by the polygon mirror; and a first scanning lens 7a and a second scanning lens 7b, which constitute a third optical system that focuses the beams deflected by the deflector 6 into optical spots on a scanned surface (photosensitive element) 8.

The VCSEL 1 emits a plurality of laser beams, the coupling lens 2 couples the laser beams, the aperture 3 limits thicknesses of the collimated beams emitted from the coupling lens 2, and the cylindrical lens 5 shapes the beams into a line. The plurality of laser beams are, after being coupled, deflected and reflected by the deflector 6 having the rotating polygon mirror, and then are made to scan in the main-scanning direction. Furthermore, the first scanning lens 7a and the second scanning lens 7b cause the scanned surface 8 as an imaging plane, i.e., a photosensitive element of a photosensitive drum as an image carrier, to be exposed by the laser beams to form a latent image so that image formation is performed.

With reference to FIG. 2, features of the ND filter 4 will be described. As one type of the ND filter, an ND filter is known in which a neutral density film such as a metal film made of chrome or inconel for example or a dielectric film is coated on a surface of a glass substrate (hereinafter, referred to as "glass plate") serving as a substrate having a first surface and a second surface and made of a transparent plate so that a part of light can be reflected or absorbed by the neutral density filter. Herein, a chrome film is formed by applying neutral density coating onto the first surface (one surface) on the light source (VCSEL 1) side of the glass plate to reflect a part of light (this concrete example is also used in a second embodiment, a modified example of the second embodiment, and the like, except when it is noted otherwise).

When the second surface (other surface) of the ND filter 4 is remained as it is and the collimated beams enter the ND filter 4, reflected light from the second surface of the glass plate returns to the first surface, resulting in occurrence of multiple interference. Therefore, it is preferable to apply multilayer coating as antireflection coating onto the second surface to reduce reflectance close to 0 as much as possible to make the reflectance of the second surface smaller than that of the first surface.

An optical thin film is generally formed by a dry process such as vacuum vapor deposition, sputtering, and CVD (Chemical Vapor Deposition). As desired capability of the antireflection film, a wide incident angle range and low reflectance are required. To meet this capability requirement, it is known that a multilayer film should preferably be formed by combining a plurality of coating materials having different refractive indices. It is also known that optical performance of the multilayer film can be improved when differences between the refractive indices of the various coating materials to be used are increased and minimum refractive indices of the various coating materials to be used are lowered. Described above is the reason why the multilayer film is desirable as the second surface of the ND filter.

Figure 20:
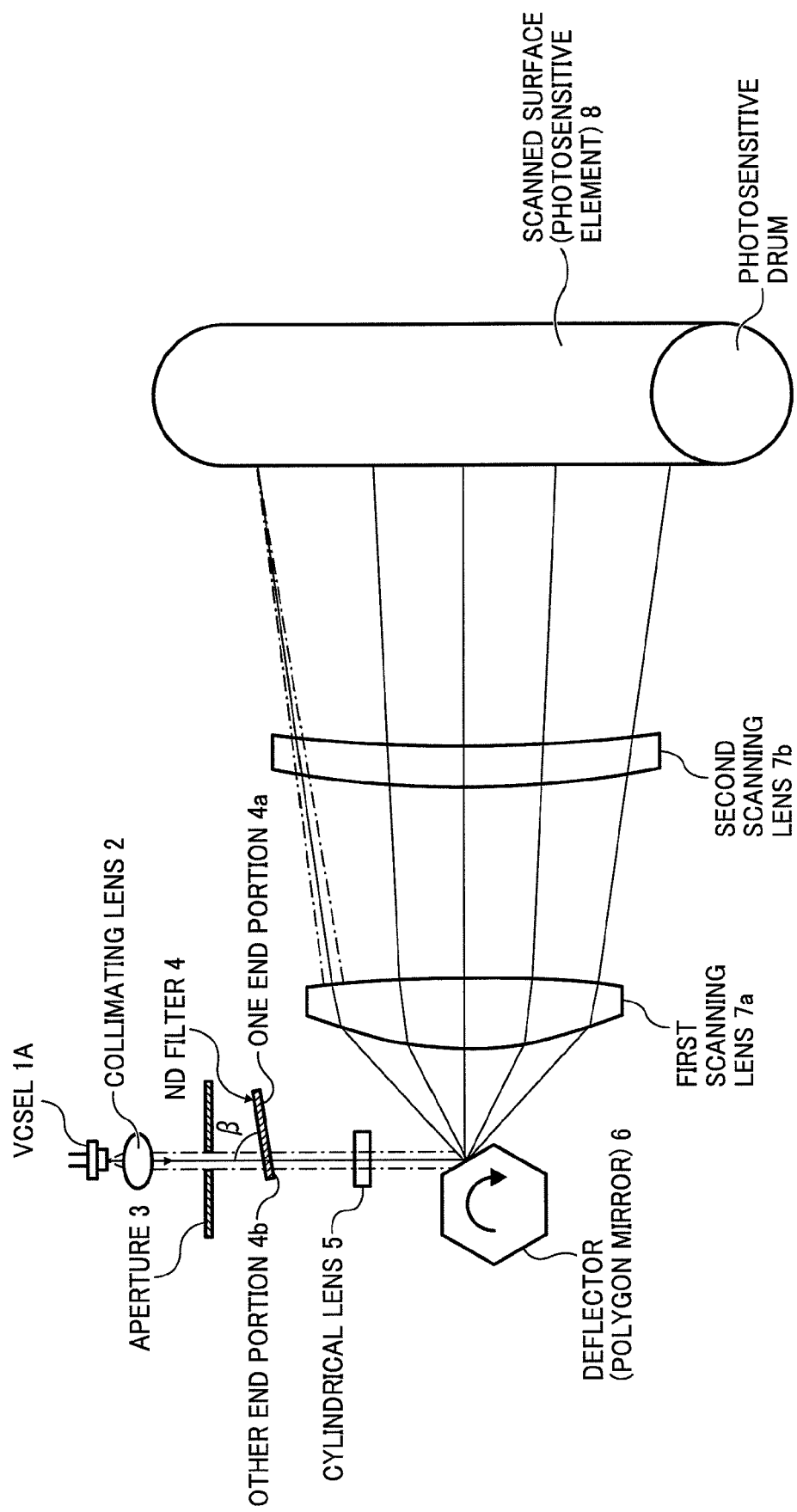
FIG. 20 is a diagram of an entire configuration of an optical system of an optical scanning device of a first example of the present invention.

FIG. 1 and FIG. 20, which will be described later, are diagrams illustrating a layout of elements of the optical scanning device on a plane perpendicular to a rotation axis of the deflector. The ND filter 4 is preferably inclined with respect to a moving direction of a principal ray of the laser light beams such that reflected light from the first surface on the VCSEL 1 or a VCSEL 1A side does not return to the VCSEL 1 or the VCSEL 1A and the reflected light does not enter the first scanning lens 7a. In other words, it is preferable to incline the ND filter 4 such that one end portion 4a is positioned closer to the light source than other end portion 4b (inclination angle β) as illustrated in FIGS. 1 and 20 so that the reflected light from the first surface on the VCSEL 1 or the VCSEL 1A side does not return to the VCSEL 1 or the VCSEL 1A and the reflected light does not enter the first scanning lens 7a.

If the reflected light from the first surface of the ND filter 4 returns to the VCSEL 1 or the VCSEL 1A, a light output becomes unstable, which is problematic. Furthermore, if the reflected light enters the photosensitive element via the first scanning lens 7a, it may cause unexpected exposure as ghost light. To prevent the above-mentioned problems, it is preferable to incline the ND filter 4 with respect to the moving direction of the principal ray of the laser beams such that the one end portion 4a is positioned closer to the light source than the other end portion 4b as illustrated in FIGS. 1 and 20.

Regarding the ND filter 4, in the above explanation, an example using the glass substrate made of a transparent plate is described. However, a plastic substrate made of a transparent plate can also be used for the ND filter 4.

The second surface of the ND filter 4 is not limited by the surface coated with the multilayer coating as the antireflection coating as long as it allows reduction of the reflectance. For example, it is possible to form a microstructure smaller than a wavelength of a laser to be used on the second surface of the ND filter 4, that is, it is possible to perform a microfabrication process such as a sub-wavelength grating (SWS: Sub-Wavelength Structure).

Second Embodiment

Figure 3:
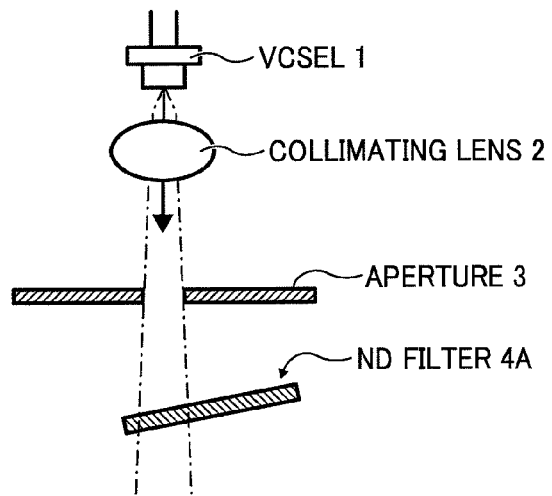
FIG. 3 is a diagram of main components of an optical system of an optical scanning device according to a second embodiment of the present invention.
Figure 4:
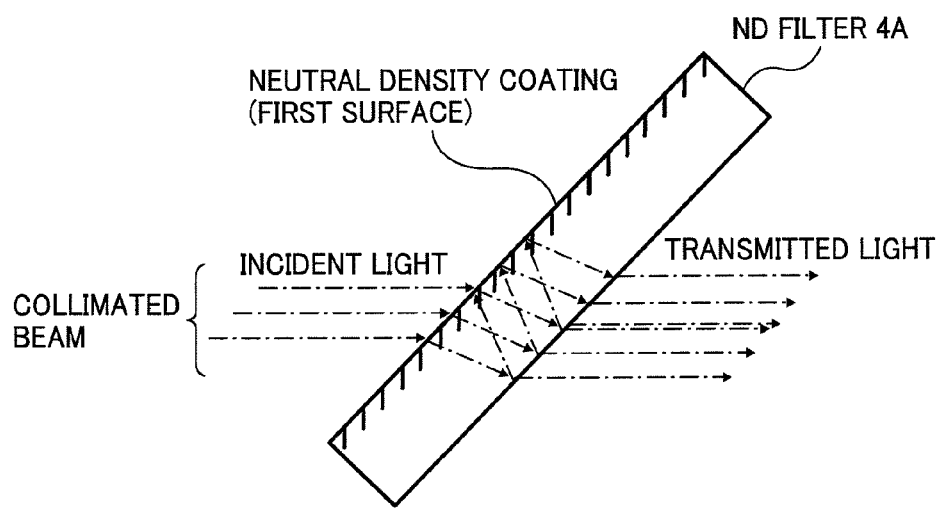
FIG. 4 is a diagram illustrating a configuration and action of an ND filter used in the optical scanning device according to the second embodiment.
Figure 5:
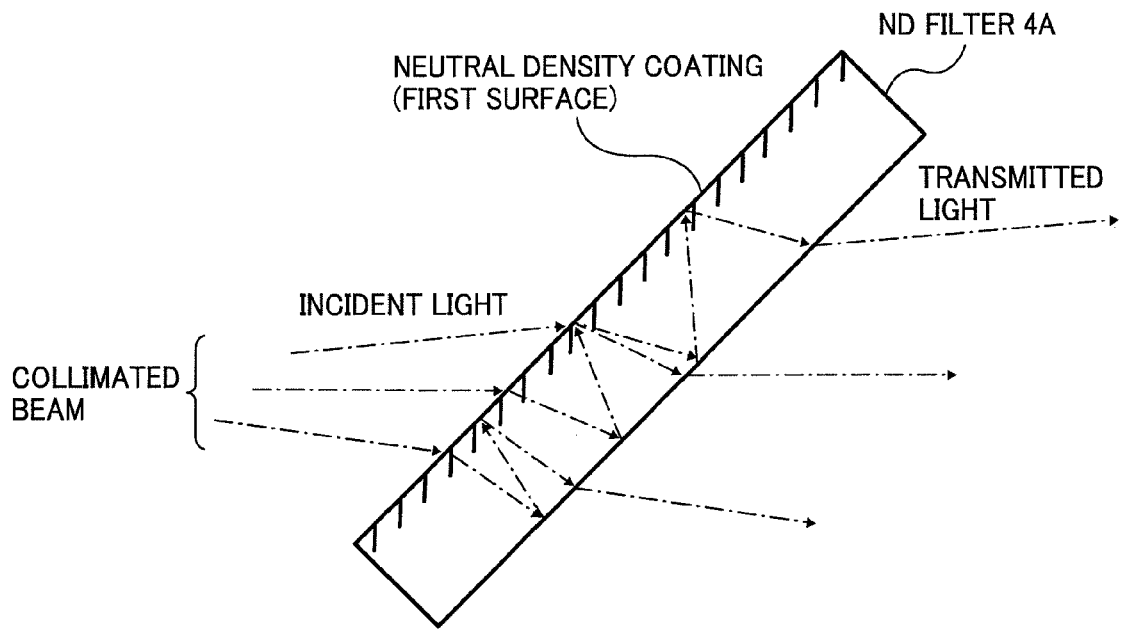
FIG. 5 is a diagram illustrating the configuration and an effect of the action of the ND filter used in the optical scanning device according to the second embodiment.

With reference to FIGS. 3 to 5, an optical scanning device according to a second embodiment of the present invention will be described. FIG. 3 illustrates main components of the optical scanning device according to the second embodiment. The second embodiment is different from the optical scanning device of the first embodiment illustrated in FIG. 1 in that the degree of refraction for refracting the laser beams emitted from the VCSEL 1 by the first optical system is changed as illustrated in FIG. 3. The configuration of the second embodiment except this difference is the same as the optical scanning device of the first embodiment illustrated in FIG. 1.

The degree of refraction for refracting the laser beams emitted from the VCSEL 1 by the first optical system can be changed by changing a structure of the coupling lens, e.g., a curvature of its curved shape, to change the degree of convergence; changing its layout position with respect to the VCSEL 1; or making a structure by a combination of the above changes.

In the present embodiment, an ND filter 4A can be configured such that only a first surface made of a glass plate is coated with the neutral density coating and a second surface on the opposite side is not coated with the antireflection coating. In other words, it is possible to omit application of the antireflection coating onto the second surface.

More specifically, as illustrated in FIG. 3, unlike the first embodiment in which the laser beams from the VCSEL 1 are collimated by the coupling lens 2, the coupling lens 2 of the second embodiment is configured and disposed to generate slightly divergent beams in comparison with the collimated beams, and the ND filter 4A is disposed between the coupling lens 2 (the first optical system) and the cylindrical lens 5 (the second optical system).

Figure 19:
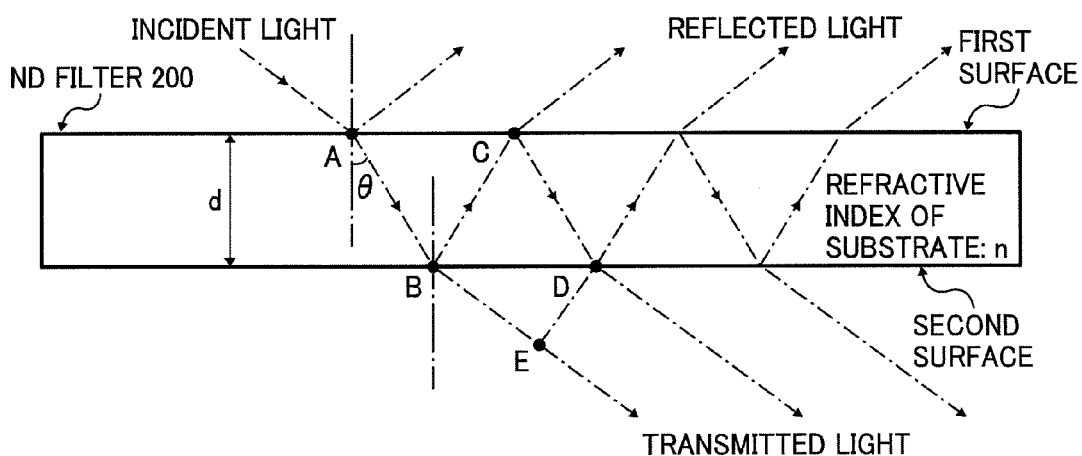
FIG. 19 is a diagram for explaining the problem to be solved by the present invention, multiple interference in an ND filter when the ND filter is used, and equations representing the multiple interference.

With reference to FIGS. 4 and 5, the effect of the second embodiment will be described. As illustrated in FIG. 4 (or in FIG. 19 as mentioned earlier), when the collimated beams are input to the ND filter 4A, because each ray of the beams has the same optical path length in the glass plate (between rays reflected the same number of times), multiple interference occurs.

In contrast, as illustrated in FIG. 5, when the divergent beams are input to the ND filter 4A, because each ray of the beams has a different optical path length in the glass plate even when the rays are reflected the same number of times, interference does not occur. Therefore, making output beams from the coupling lens be divergent or convergent beams is effective and desirable to prevent the multiple interference.

Figure 6:
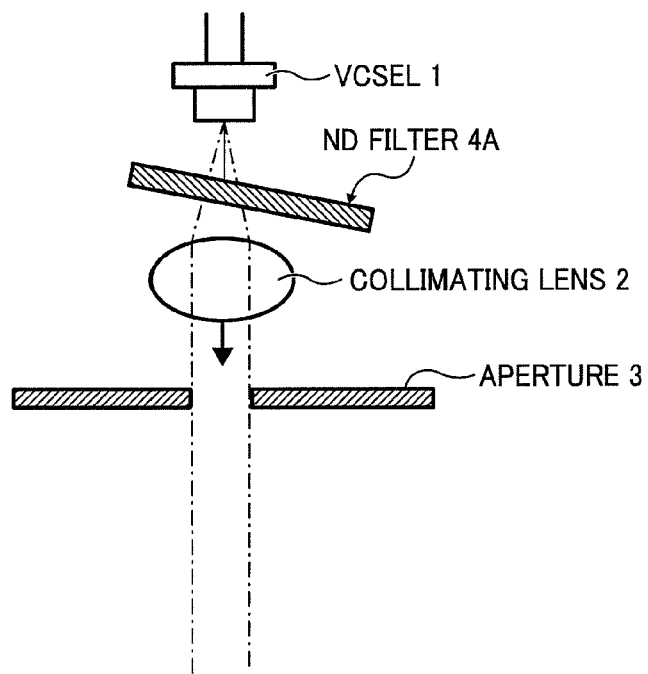
FIG. 6 is a diagram of main components of an optical system of an optical scanning device according to a modified example of the second embodiment.

FIG. 6 illustrates a modified example of the second embodiment. This modified example is different from the first embodiment in that the ND filter 4A serving as the light-quantity adjusting element and having the neutral density coating only on the first surface on the light source (VCSEL 1) side of the glass plate is used instead of the ND filter 4, and the ND filter 4A is disposed between the VCSEL 1 and the coupling lens 2.

In this manner, when the ND filter 4A is disposed between the VCSEL 1 and the coupling lens 2, because the laser beams emitted from the VCSEL 1 are divergent beams and the divergent beams are input to the ND filter 4A as incident beams, the multiple interference does not occur and the beams output from the coupling lens 2 can be the collimated beams.

Third Embodiment

Figure 7:
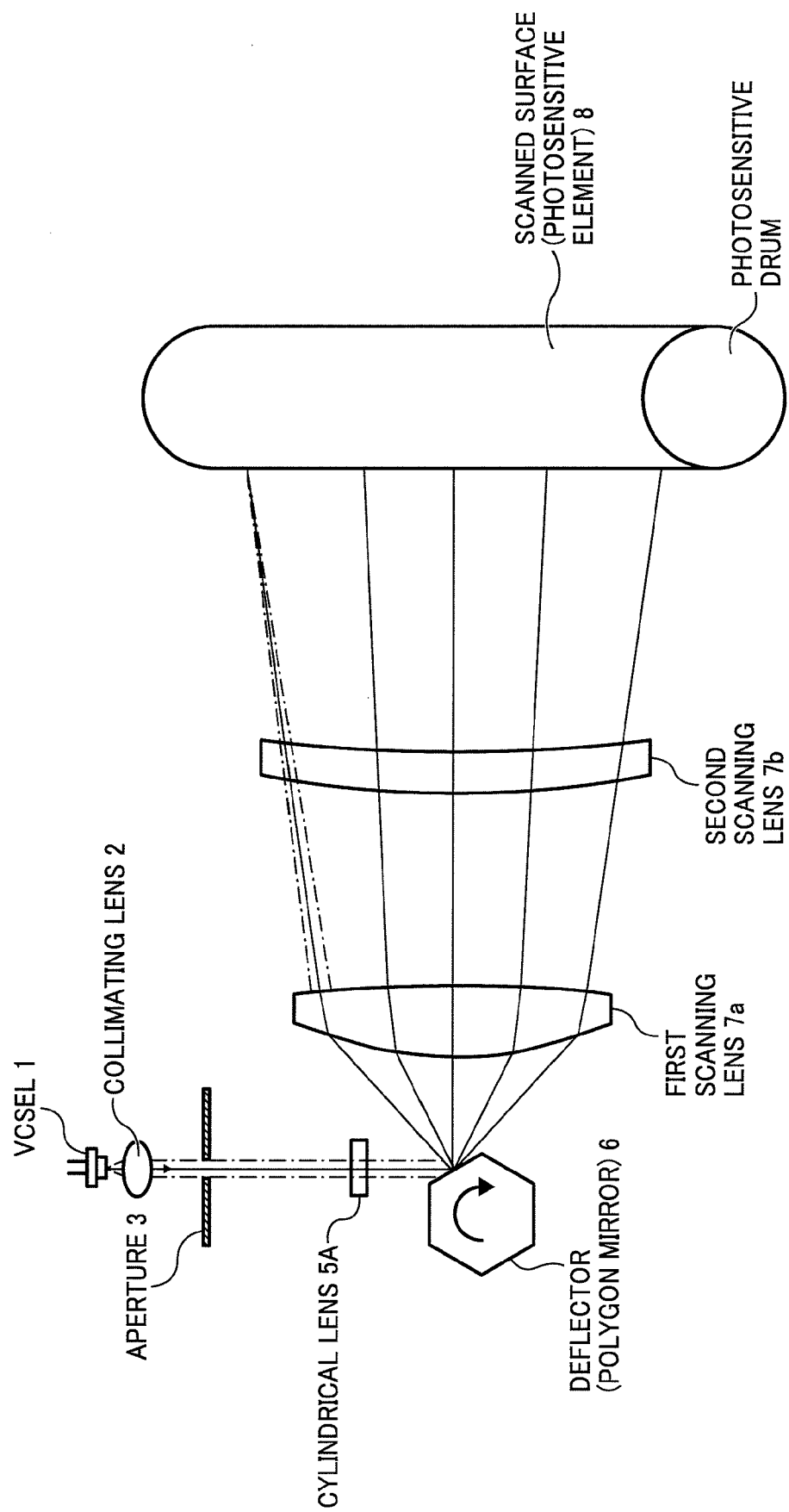
FIG. 7 is a diagram of an entire configuration of an optical system of an optical scanning device according to a third embodiment of the present invention.
Figure 8:
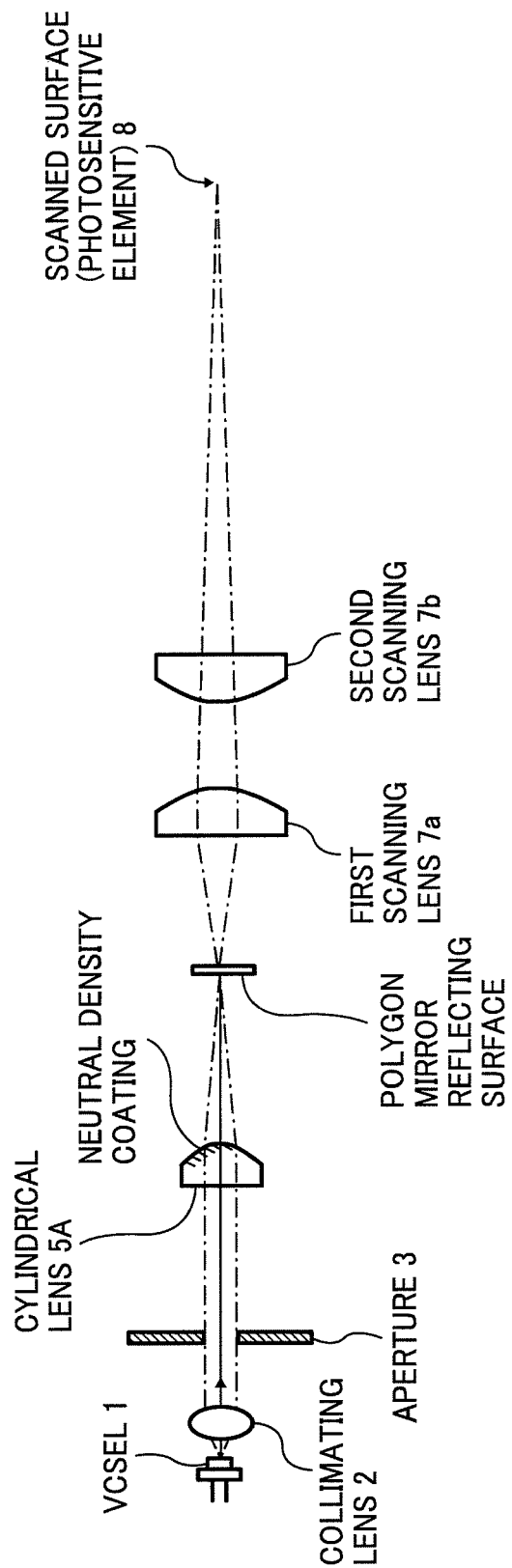
FIG. 8 is a diagram of the whole optical system of the optical scanning device according to the third embodiment when viewed from a cross section in a sub-scanning direction.

With reference to FIGS. 7 to 11, an optical scanning device according to a third embodiment of the present invention will be described. FIG. 7 is a diagram of an entire configuration of an optical system of the optical scanning device according to the third embodiment. FIG. 8 is a diagram of the whole optical system of the optical scanning device illustrated in FIG. 7 when viewed from a cross section in the sub-scanning direction.

The third embodiment is different from the first embodiment mainly in that the ND filter 4 is removed from the configuration of the optical scanning device of the first embodiment, and a cylindrical lens 5A, instead of the cylindrical lens 5 having a curved surface, is used in which the neutral density coating is applied onto the curved surface (in this example, a surface of the cylindrical lens 5A on the polygon mirror side as illustrated in FIG. 8).

Specific operations for applying the neutral density coating onto the curved surface on the polygon mirror side of the cylindrical lens 5A can of course be performed in the same manner as the formation of a general optical thin film as described in the first embodiment.

Figure 9:
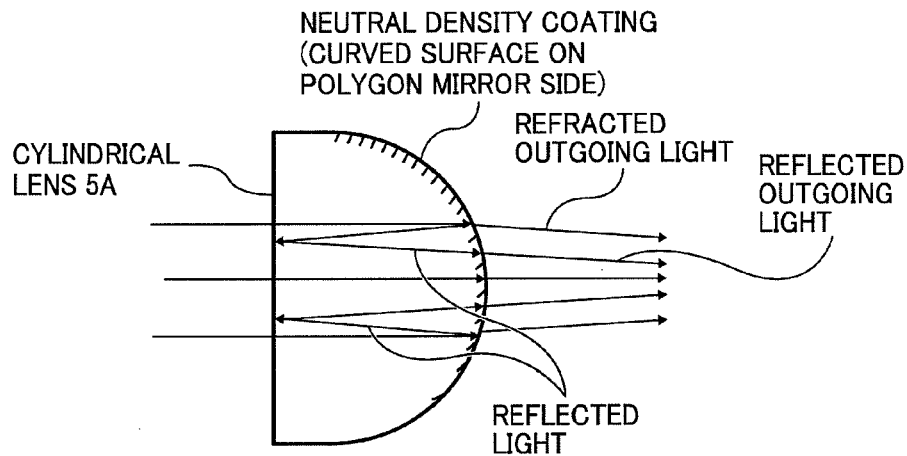
FIG. 9 is a diagram illustrating a configuration and an effect of action of a cylindrical lens used in the optical scanning device according to the third embodiment.
Figure 10:
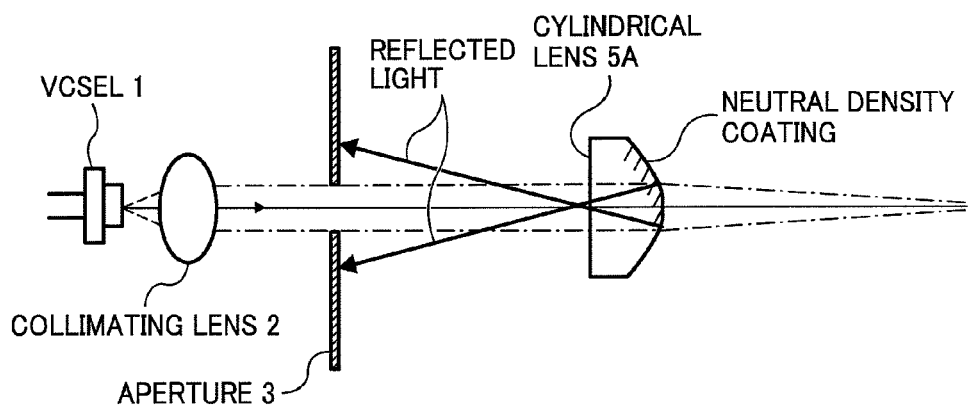
FIG. 10 is a diagram illustrating a configuration and an effect of action of a main optical system of the optical scanning device according to the third embodiment.

With reference to FIGS. 9 and 10, an effect by use of the cylindrical lens 5A will be described. As illustrated in FIG. 9, among the collimated beams entered the cylindrical lens 5A, a phase of light deflected by and output through the curved surface on the polygon mirror side of the cylindrical lens 5A and a phase of light reflected by and output from the curved surface on the polygon mirror side do not become equal to each other (although some lights may become partially equal to one another, a state in which the multiple interference occurs by the whole beams does not happen).

However, this is on condition that the reflected light from the curved surface of the cylindrical lens 5A is not collected on the VCSEL 1. This is because, as described above, if the reflected light returns to the VCSEL 1, the light output may not be stabilized. More specifically, as illustrated in FIG. 10, it is desirable that the reflected light is once converged and then diverged between the VCSEL 1 and the cylindrical lens 5A.

Figure 11:
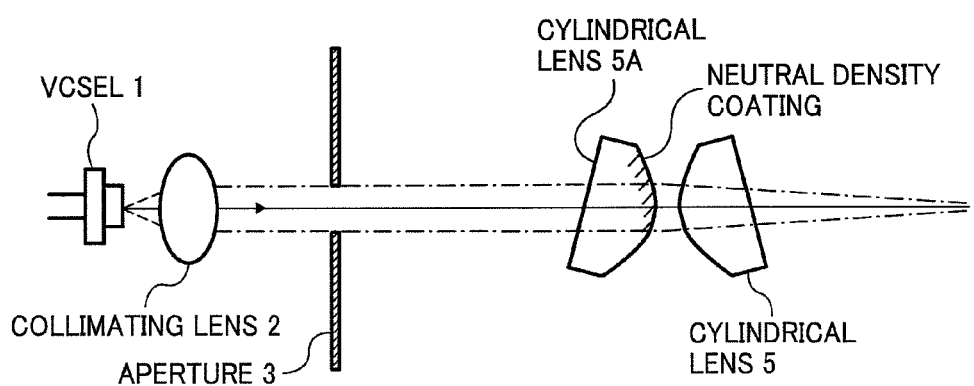
FIG. 11 is a diagram of configurations of two cylindrical lenses used in another optical scanning device according to the third embodiment.

If the return light to the VCSEL 1 is a concern, it is possible to incline the cylindrical lens. In this case, distortion may be degraded or a focal point may be displaced from an optical axis compared to the cylindrical lens disposed vertically with respect to the optical axis. However, if refractive power of the cylindrical lens is divided into two lenses, i.e., if the cylindrical lens 5A as one of the two lenses is inclined and the cylindrical lens 5 as the other of the two lenses is disposed so that their curved surfaces face each other as illustrated in FIG. 11, the focal point can be positioned on the optical axis and the distortion can be improved.

Fourth Embodiment

Figure 12:
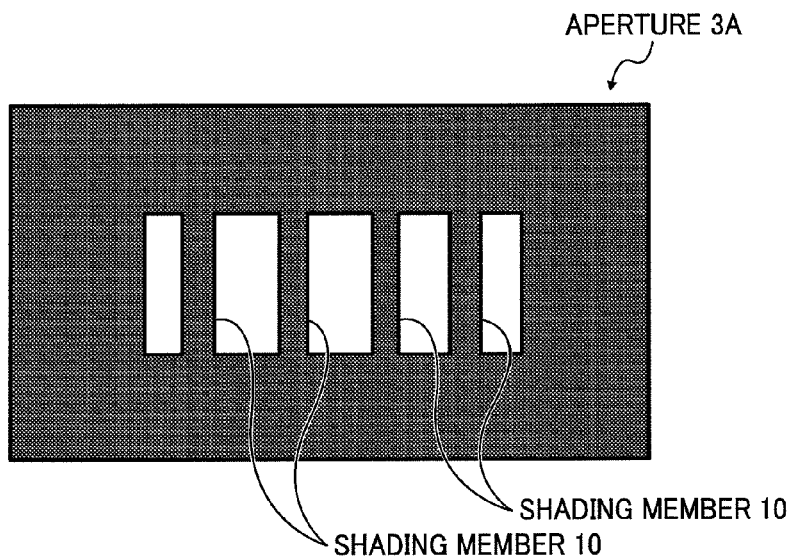
FIG. 12 is a diagram of a shading member integrally formed on an aperture used in an optical scanning device according to a fourth embodiment of the present invention.

With reference to FIG. 12, an optical scanning device according to a fourth embodiment of the present invention will be described. The fourth embodiment is different from the third embodiment mainly in that the cylindrical lens 5 being the same as the first embodiment is used instead of the cylindrical lens 5A to which the neutral density coating is applied, and a shading member 10 having a slit pattern (white areas) through which beams can pass is arranged in an aperture 3A as illustrated in FIG. 12.

The aperture 3A is different from the aperture 3 in that the shading member 10 is integrally formed therewith as illustrated in FIG. 12 in which a passage port of the aperture 3A is viewed from the VCSEL 1 side. In this manner, when the light quantity of a laser output from the coupling lens 2 is reduced by the shading member 10, it is not necessary to worry about occurrence of the multiple interference in the ND filter. By devising the pattern of the laser beam passage port of the shading member 10, it is possible to minimize the effect on a beam spot diameter.

The optical scanning device of the present invention is not limited to the optical scanning devices of the first to the fourth embodiments and the modified example as described above, and can basically be realized by any device that includes the vertical-cavity surface-emitting laser (VCSEL) and the specific light-quantity adjusting element (ND filter) as described above. In view of this, the optical scanning device of the present invention can be broadly expressed as follows.

That is, the optical scanning device of the present invention includes a vertical-cavity surface-emitting laser light source that emits laser beams perpendicular to a top surface thereof; at least one lens that focuses laser beams emitted from the light source; a deflecting unit that deflects the laser beams; and a light-quantity adjusting element disposed between the light source and the deflecting unit and including a substrate having a first surface and a second surface. Herein, the light-quantity adjusting element is configured such that the neutral density coating is applied onto the first surface so that the reflectance of the second surface is made smaller than that of the first surface.

Fifth Embodiment

Figure 13:
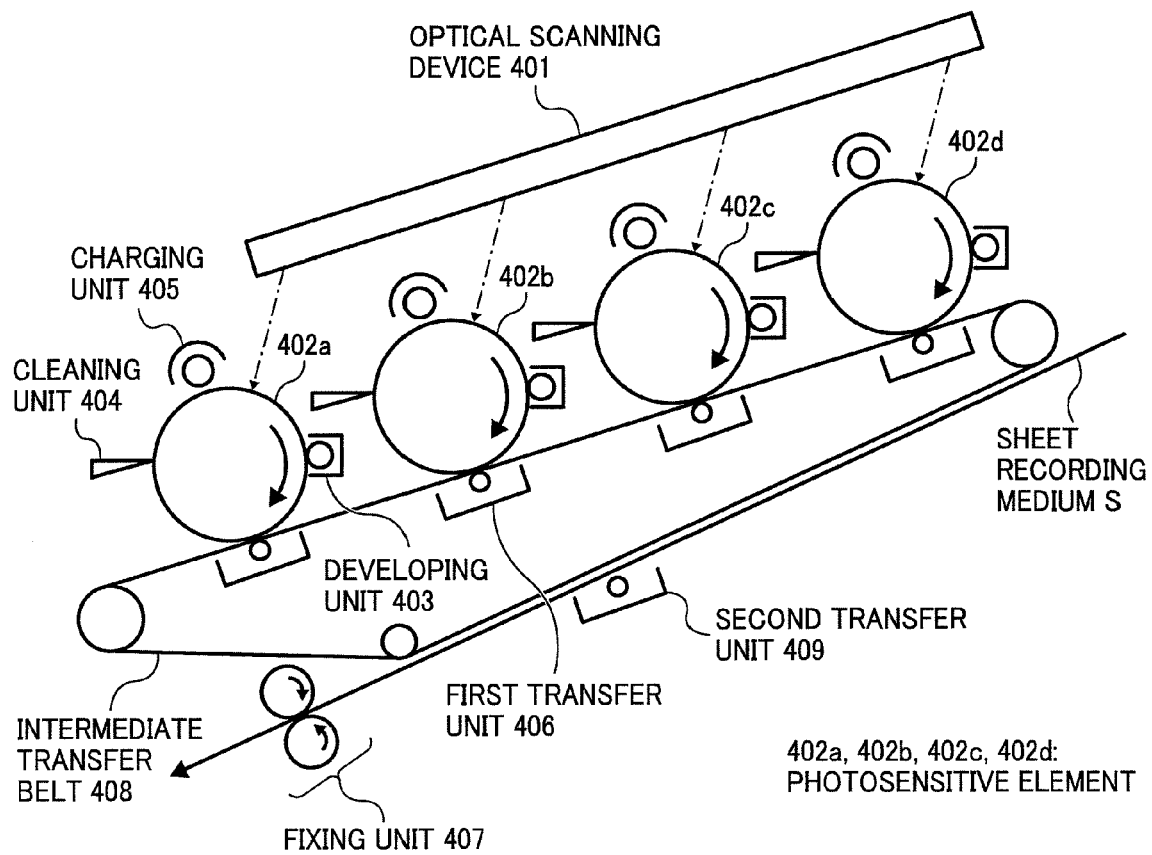
FIG. 13 is a diagram of a general configuration of an image forming apparatus having an optical scanning device according to a fifth embodiment of the present invention.

FIG. 13 is a diagram of a general configuration of an image forming apparatus having an optical scanning device according to a fifth embodiment of the present invention.

The image forming apparatus illustrated in FIG. 13 is a full-color image forming apparatus that forms full color images by using four color toners such as yellow toner, cyan toner, magenta toner, and black toner as developer. In the full-color image forming apparatus, as illustrated in the figure, optically conductive photosensitive elements 402a to 402d as image carriers rotate clockwise as indicated by arrows in the figure at substantially constant velocity. Herein, the four photosensitive elements 402a to 402d arranged to form a full color image have the same configurations except color of toner to be used. Therefore, suffixes of the symbols of the photosensitive elements will be omitted. An optical scanning device 401 includes the above-mentioned optical scanning devices of the first to the fourth embodiments.

The surfaces of the photosensitive elements 402 are uniformly charged by a charging unit 405, and the optical scanning device 401 performs exposure scanning on the photosensitive elements 402. Electrostatic latent images written into the photosensitive elements 402 by the exposure are visualized as toner images by a developing unit 403, and a first transfer unit 406 sequentially transfers the toner images visualized on the plurality of the photosensitive elements 402 onto an endless intermediate transfer belt 408 serving as an intermediate transfer unit to form a single image. As a result, a superimposed full color image is formed. The full color image on the intermediate transfer belt 408 is collectively transferred onto a sheet recording medium S by a second transfer unit 409, fixed by a fixing unit 407 to complete the image formation, and discharged out of the apparatus appropriately.

Residual toner or paper powder untransferred and remained on the photosensitive elements 402 is removed by a cleaning unit 404. Thereafter, the photosensitive elements 402 are re-charged by the charging unit 405. Furthermore, residual toner or paper powder remained on the intermediate transfer belt 408 is removed by a belt cleaning unit not illustrated.

In this full-color image forming apparatus, when the above-mentioned optical scanning devices are used as the optical scanning device 401, variation in the light use efficiency between the optical scanning devices can be reduced and desired image formation at high speed and with high resolution can be performed.

The above embodiment is explained with an example using a tandem type image forming apparatus that transfers images onto the intermediate transfer unit and then collectively transfers the images onto a sheet recording medium. However, the present invention can also be applied to a direct-transfer tandem type color image forming apparatus that sequentially transfers and superimposes images while simultaneously conveying a sheet recording medium by an endless belt.

Sixth Embodiment

Figure 14:
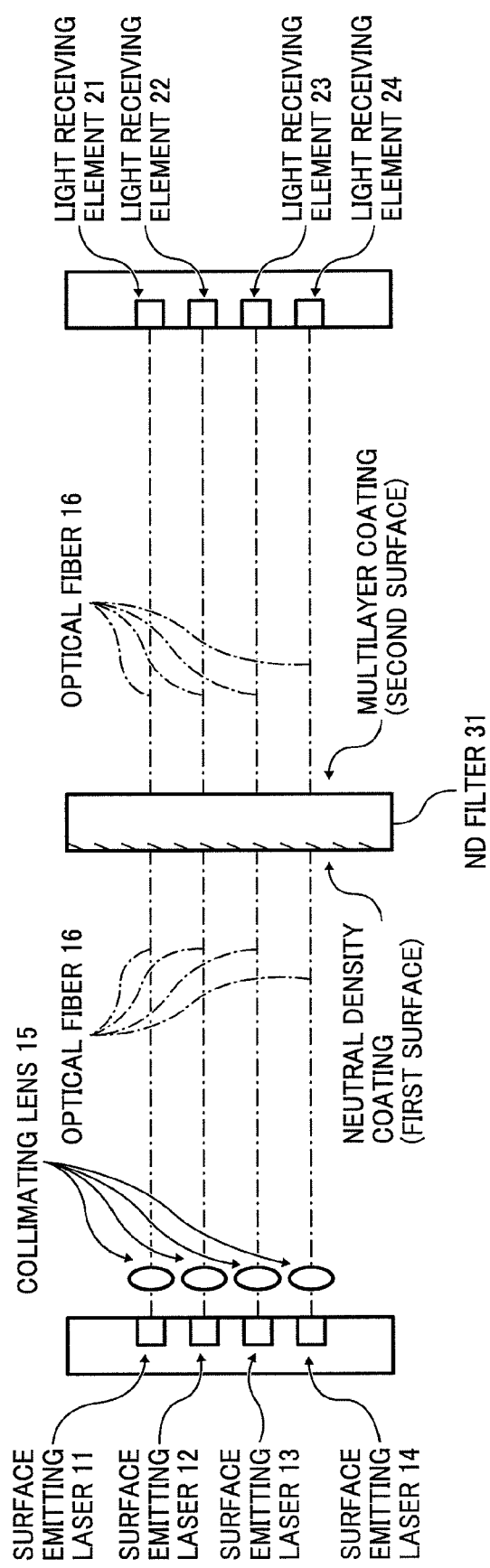
FIG. 14 is a diagram illustrating an optical transmission module of an optical communication system according to a sixth embodiment of the present invention.
Figure 15:
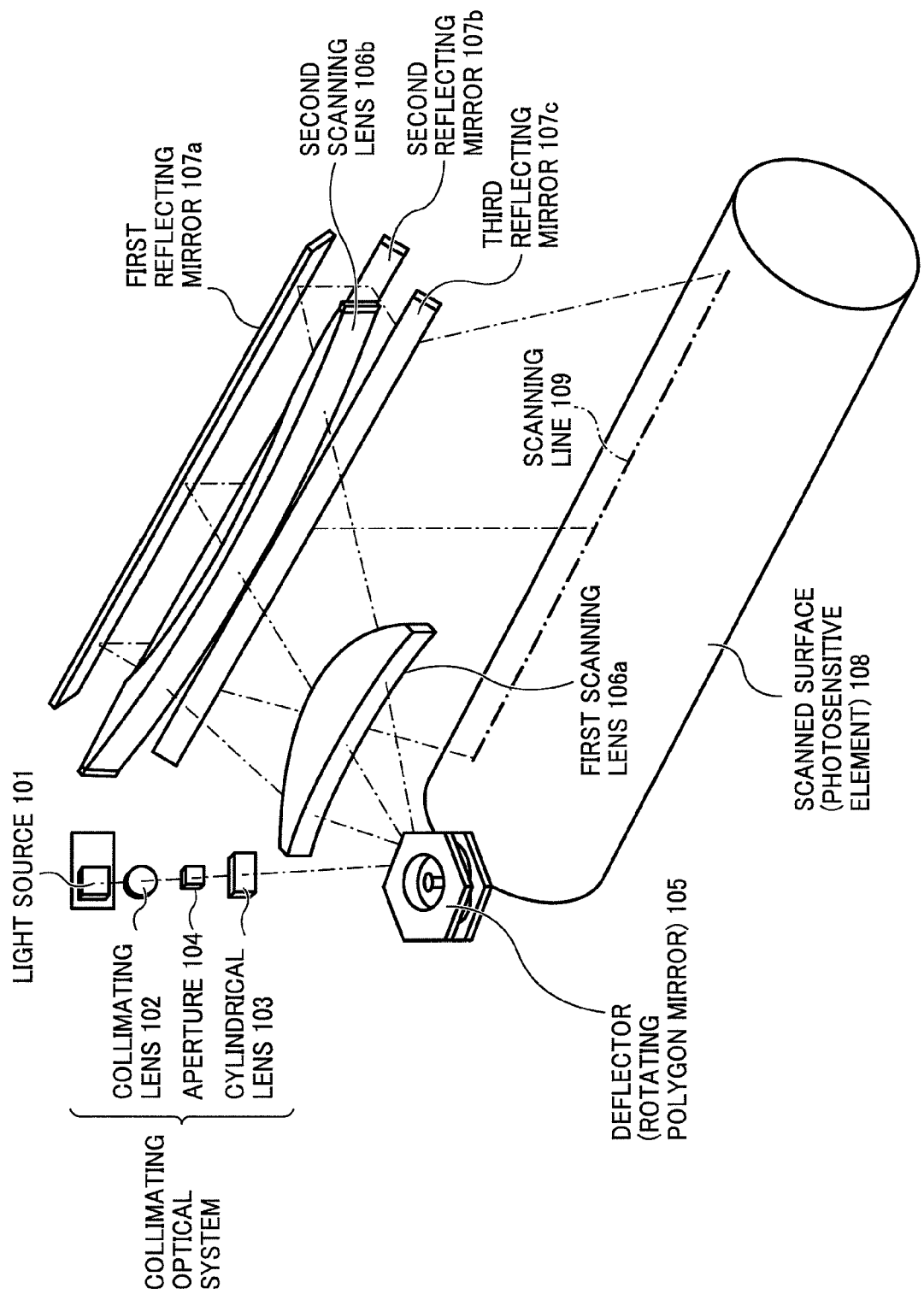
FIG. 15 is a diagram of an entire configuration of an optical system of a conventional optical scanning device.
Figure 16:
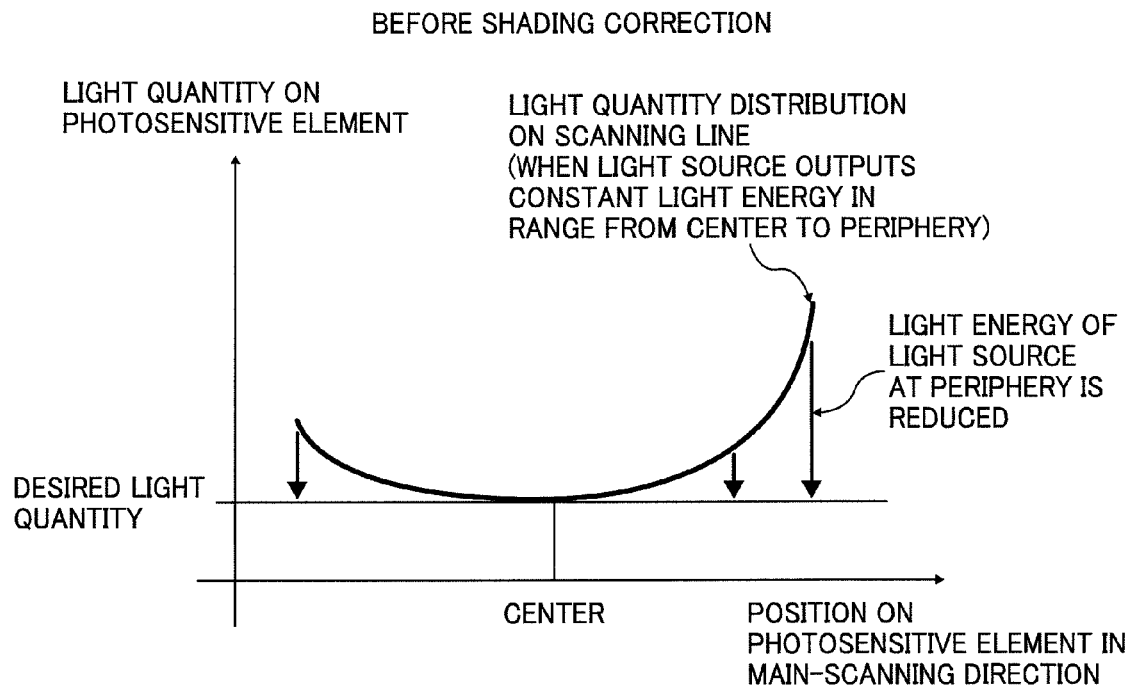
FIG. 16 is a diagram for explaining a problem to be solved by the present invention and a relationship between a position on a photosensitive element in a main-scanning direction and a light quantity on the photosensitive element before shading correction is performed.
Figure 17:
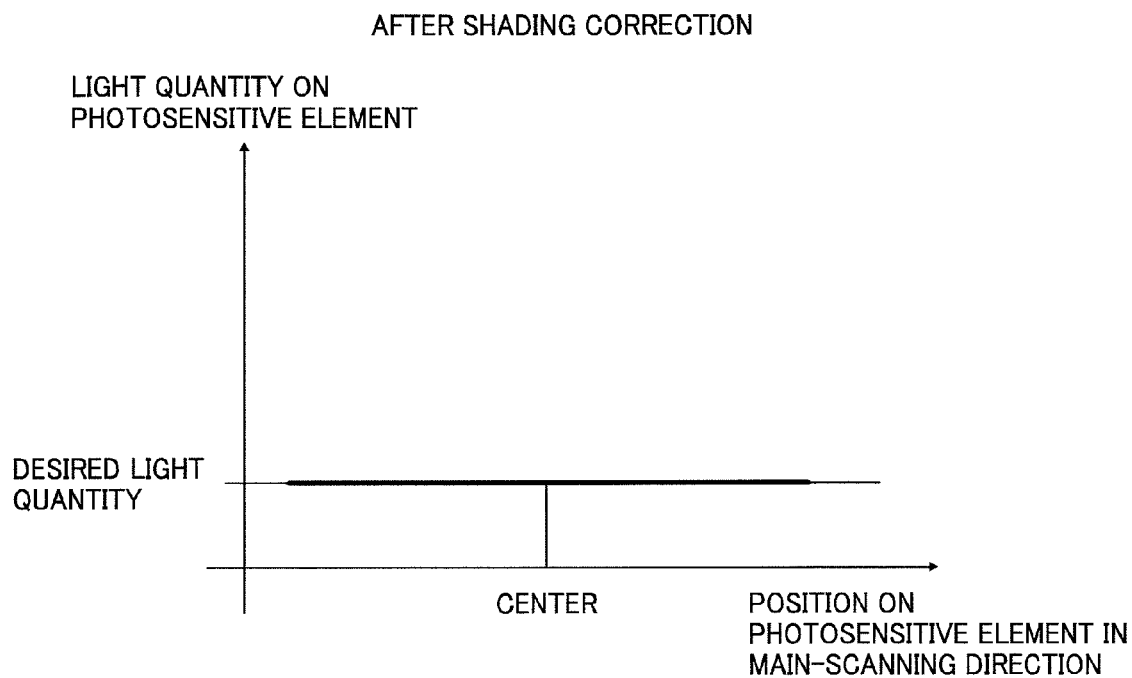
FIG. 17 is a diagram for explaining the problem to be solved by the present invention and an ideal relationship between the position on the photosensitive element in the main-scanning direction and the light quantity on the photosensitive element after shading correction is performed.
Figure 18:
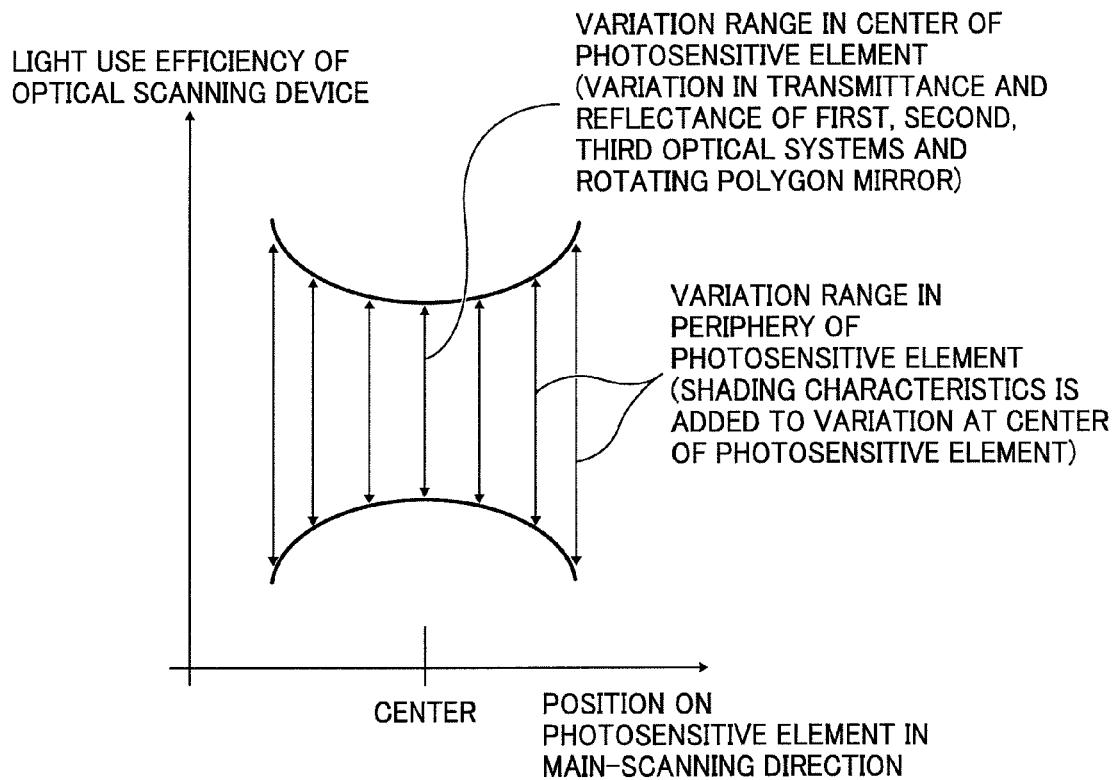
FIG. 18 is a diagram for explaining the problem to be solved by the present invention and variation in light use efficiency of a scanning optical system, i.e., a relationship between the position on the photosensitive element in the main-scanning direction and the light use efficiency of the optical scanning device.

With reference to FIG. 14, an optical communication system according to a sixth embodiment of the present invention will be described. A technical aim of the present invention is to resolve a problem that occurs when the VCSEL (surface emitting laser) as a light source and the ND filter are combined with each other. Therefore, the present invention is not necessarily limited to the optical scanning device and the image forming apparatus, and can also be applied to optical communications.

FIG. 14 is a diagram illustrating an optical transmission module of an optical communication system according to the sixth embodiment. As illustrated in the figure, the optical transmission module of the optical communication system of the present embodiment is formed by a combination of a surface-emitting laser array chip, optical fibers, and an ND filter as the light-quantity adjusting element.

In the example of the present embodiment, laser beams from surface emitting lasers 11 to 14 as light sources are coupled and shaped by a coupling lens 15, input to and transferred through optical fibers 16, and received by light receiving elements 21 to 24. To transfer more number of pieces of data simultaneously, parallel transmission using the surface-emitting laser array on which a plurality of surface emitting lasers are integrated is made available.

In this case, an ND filter 31 is disposed between the surface emitting lasers 11 to 14 and the light receiving elements 21 to 24 to enable light quantity adjustment. On the ND filter 31, similarly to that explained in the first embodiment for example, the neutral density coating is applied onto its first surface on a light source side to form a chrome film for example. Furthermore, the multilayer coating is applied onto a second surface of the ND filter 31 to reduce reflectance of the second surface close to 0 so that the reflectance is made smaller than the first surface.

In this manner, by arranging the ND filter 31 as the light-quantity adjusting element of the present invention in the passageway of optical transmission, the following problem can be solved. That is, in a conventional ND filter, light that has entered the ND filter causes the multiple interference because of multiple reflection between the first surface and the second surface within the filter. Therefore, output light from the conventional ND filter contains the multiple interference light in addition to normal light that is desirable for use in the optical transmission. Light quantity of the multiple interference light increases or decreases depending on wavelength variation that occurs along with light output variation of the surface-emitting laser array chip. Therefore, in the conventional ND filter, the transmitted light quantity from the ND filter may not be linearly correlated with the light output variation, which is problematic (the above-mentioned normal light desirable for use in the optical transmission has a linear relationship). In contrast, the ND filter 31 of the present embodiment allows to reduce the above-mentioned multiple interference light close to 0 (zero) and adjust the laser light quantity before the output laser light from the surface emitting lasers 11 to 14 reaches the light receiving elements 21 to 24. Therefore, the linear relationship between the light output variation of the surface-emitting laser array chip and the transmitted light quantity from the ND filter can be ensured, that is, a 1:1 relationship can be ensured.

Example 1

With reference to FIGS. 20 to 27, a first example of the above-mentioned first embodiment will be described.

As described above, the present invention is made to achieve the above-mentioned remarkable effects by generating a synergistic effect by an organic combination of the features of the VCSEL and the ND filter in the optical system having the VCSEL and the ND filter and located anterior to the polygon mirror. In the explanation of the first example and a second example which is to be described later, particular attention will be paid on the following close relationships between the features of the VCSEL and the ND filter: firstly, a relationship between the VCSEL and the reflectance of the ND filter; secondary, a relationship between the thickness of the ND filter and the reflectance of the ND filter; and thirdly, a relationship between the VCSEL, the thickness of the ND filter, and the reflectance of the ND filter. The mutual relationship between the VCSEL and the ND filter will be clarified and a structure will be described that is able to suppress more light quantity difference between the light-emitting points caused by "transmittance waviness" described later.

If the VCSEL has low single wavelength performance like an edge emitting LD, even when the optical system having the VCSEL and the ND filter and located anterior to the polygon mirror is used, linear-function-like linearity of the transmitted light quantity from the ND filter is not lost according to increase in the input current to the VCSEL, i.e., increase in the light output from the VCSEL. In other words, the transmittance of the ND filter is not changed depending on the light output from the VCSEL.

However, if such a VCSEL is used, an advantage of high single wavelength performance, i.e., an advantage that the variation in a beam spot position and a beam spot diameter on the photosensitive element, which is caused by wavelength hopping (longitudinal mode hopping), can be reduced, may be lost.

For example, in an optical scanning device of the first example illustrated in FIG. 20, when the longitudinal mode hopping occurs in the VCSEL 1A, a wavelength is changed and refractive indices of all transmissive optical elements such as the coupling lens 2, the cylindrical lens 5, the first scanning lens 7a, and the second scanning lens 7b are changed accordingly. Consequently, the focal point or the beam spot position may be displaced on the scanned surface (photosensitive element) 8.

The optical scanning device of the first example illustrated in FIG. 20 is different from that of the first embodiment illustrated in FIG. 1 only in that the VCSEL 1A serving as the vertical-cavity surface-emitting laser light source that emits laser beams perpendicular to a top surface thereof is used instead of the VCSEL 1. Except this point, the optical scanning device of the first example is the same as the optical scanning device illustrated in FIG. 1.

The first example is directed to the optical scanning device that includes the optical system having the VCSEL 1A and the ND filter 4 and located anterior to the polygon mirror. Specifically, the optical system that includes the VCSEL 1A having high single wavelength performance and the ND filter 4 is used to take the following advantages: the number of times of rotation of the polygon mirror can be reduced by multibeam (e.g., advantage of the VCSEL 1A that allows to array the light-emitting points two dimensionally); variation in the beam spot position and the beam spot diameter can be reduced (advantage of the single wavelength performance); and variation in the light use efficiency of a writing optical system can be reduced (advantage of the ND filter 4). Furthermore, a disadvantage that the transmittance of the ND filter 4 may be changed according to the light output from the VCSEL 1A can be overcome.

Figure 21:
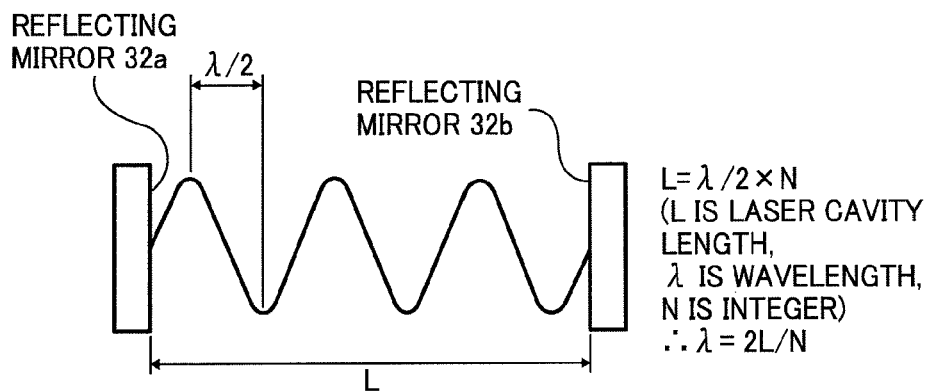
FIG. 21 is a diagram for explaining a relationship between a wavelength and a laser cavity length.

Herein, "increasing the single wavelength performance" described in the present example means nonoccurrence of the longitudinal mode hopping. As illustrated in FIG. 21, in a laser cavity, only a wave (standing wave) having nodes on the surfaces of reflecting mirrors 32a and 32b on opposing sides is present. In other words, in the laser cavity, only an optical wave equal to the integer multiple of a half wavelength is present. Herein, $\lambda=2L/N$ ($\lambda$ is a wavelength, L is a laser cavity length, and N is an integer). This hopping wave is referred to as a longitudinal mode (see FIG. 22).

Figure 22:
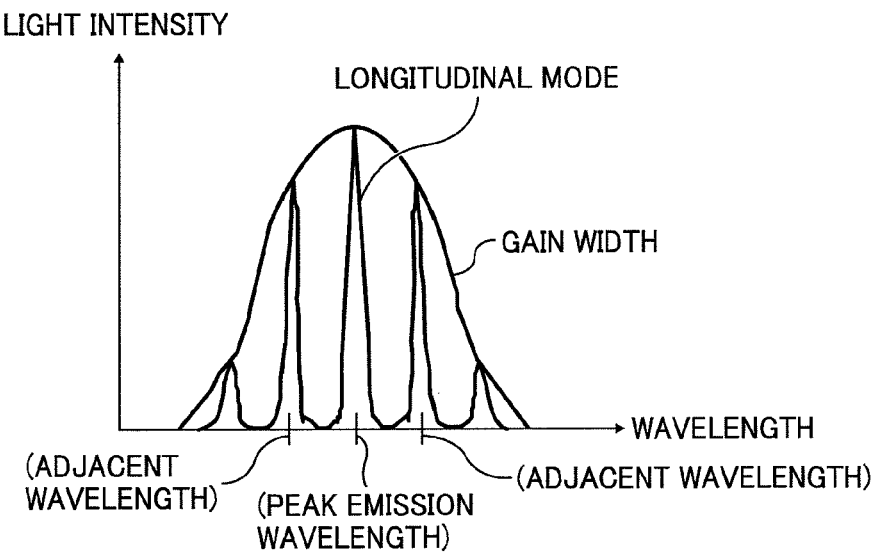
FIG. 22 is a diagram for explaining a longitudinal mode.
Figure 23:
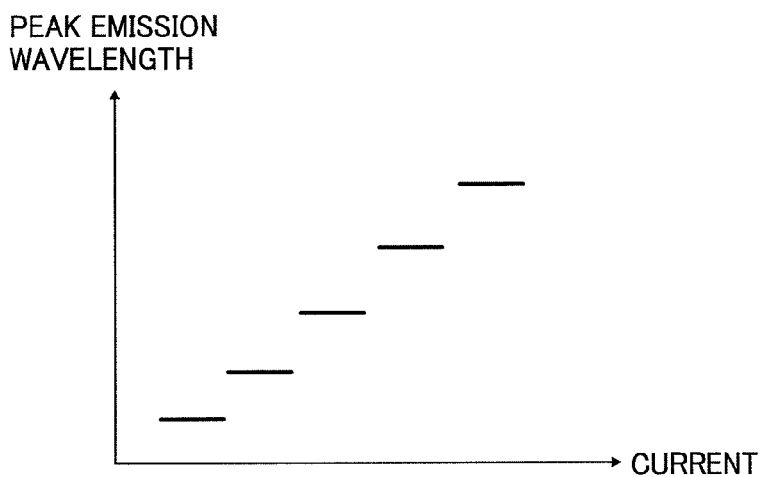
FIG. 23 is a diagram for explaining a longitudinal mode hopping phenomenon according to a relationship between a peak emission wavelength and current.

Assuming that the center wavelength $\lambda$ having the largest light intensity in FIG. 22 is referred to as a "peak emission wavelength", the peak emission wavelength is sometimes changed so as to hop toward a long wavelength side along with increase in the input current to the laser as illustrated in FIG. 23. This phenomenon is referred to as the "longitudinal mode hopping".

For example, when light with a wavelength of 1000 nm is to be emitted by an edge emitting LD with a laser cavity length L=300 μm, resonance mode order N=600, and adjacent wavelengths are 1001.7 nm and 998.3 nm. Accordingly, a difference between gains obtained by the adjacent wavelengths and that of the peak emission wavelength is small and oscillation easily occurs. Therefore, the longitudinal mode hopping occurs relatively easily according to increase in the current.

In contrast, when the VCSEL with a cavity length L=1 μm is used, resonance wavelengths are 2000 nm, 1000 nm, and 667 nm. In this case, when the gain by the oscillation is optimized to the wavelength of 1000 nm, oscillation does not occur at the wavelengths of 2000 nm and 667 nm.

Figure 24:
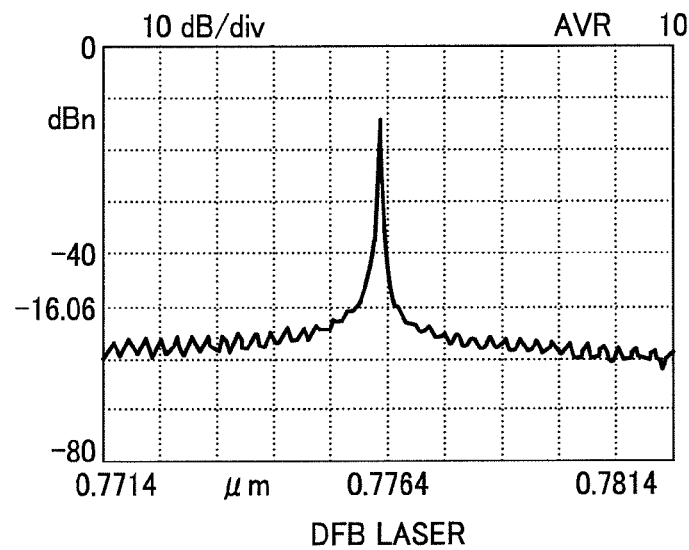
FIG. 24 is a graph of an exemplary longitudinal mode of DFB (distributed feedback) laser.

FIG. 24 is an example of the longitudinal mode of a DFB (distributed feedback) laser, which is appeared in a reference literature "Understanding Fundamentals and Applications of Semiconductor Lasers" CQ Publishing Co., Ltd., the fourth edition, pp. 93. Because each scale of the vertical axis is 10 dB, an intensity ratio (suppression ratio) between the peak emission wavelength and the second highest wavelength is far over 30 dB, which means that oscillation at the peak emission wavelength occurs at 1000 times or larger intensity. According to a reference literature "Surface Emitting Lasers" Ohmsha, Ltd., pp. 30, if the suppression ratio (side mode suppression ratio) is equal to or smaller than −35 dB or if the laser cavity length is equal to or shorter than 10 μm, the VCSEL may have similar single wavelength performance as that of the DFB laser. In other words, the longitudinal mode hopping does not occur.

In the first example, it is assumed that the VCSEL 1A has the following characteristics: the wavelength $\lambda$=780 nm; and the laser cavity length L=780 nm. It is also assumed that the ND filter 4 in FIG. 25 has the following characteristics: a surface on the light source side is a metal film and a surface on the polygon mirror side is a dielectric film; the glass substrate on which the film is formed is an optical glass with a refractive index n of 1.5; the glass substrate has a thickness d of 1.0 mm; amplitude transmittance $t_1$ of the surface on the light source side is 0.4; amplitude transmittance $t_2'$ of the surface on the polygon mirror side is 0.99; amplitude reflectance $r_1'$ of light from the glass substrate to the surface on the light source side is 0.5; and amplitude reflectance $r_2'$ of light from the glass substrate to the surface on the polygon mirror side is 0.07.

Figure 25:
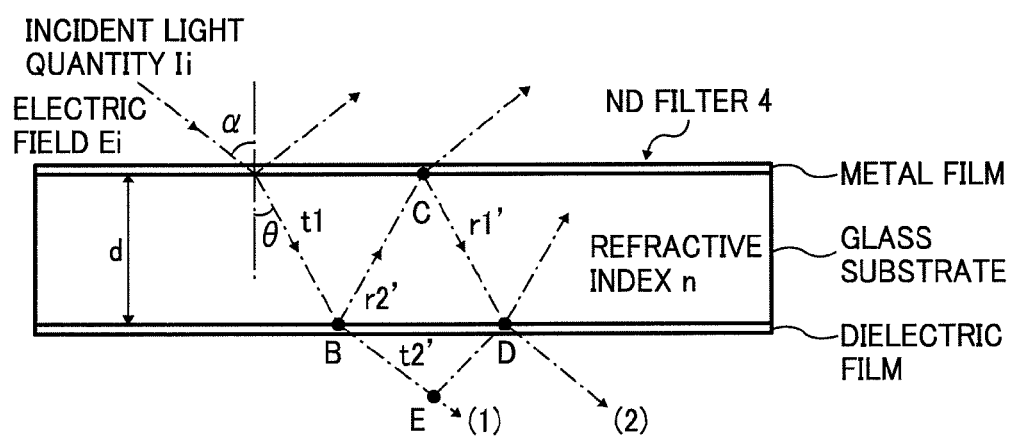
FIG. 25 is a diagram for explaining light interference in the ND filter.

In FIG. 25, assuming that an electrical field Ei of incident light is 1, the following Equations (3) and (4) are solved.

$$\text{Electric field } E1 \text{ of } (1) \text{ at point } E = t_1 t_2' \exp\left(-i\frac{2\pi}{\lambda} BE\right) \quad (3)$$

$$\text{Electric field } E2 \text{ of } (2) \text{ at point } D = \quad (4)$$
$$t_1 t_2' r_1' r_2' \exp\left\{-i\frac{2\pi}{\lambda} n(BC + CD)\right\}$$

Because reflected light from a point D on the dielectric film side is extremely weak, subsequent multiply-reflected light is not considered. Accordingly, output light quantity It can be solved by the following Equation (5) with dual-beam interference of (1) and (2).

$$It = (E1 + E2)^2 \quad (5)$$
$$= (t_1 t_2')^2 \left\{1 + (r_1' r_2')^2 + 2 r_1' r_2' \cos\left(\frac{4\pi n d \cos\theta}{\lambda}\right)\right\}$$
$$= (0.4 \times 0.99)^2 \left\{\begin{array}{l}1 + (0.5 \times 0.07)^2 + 2 \times 0.5 \times \\ 0.07\cos\left(\frac{4\pi \times 1.5 \times 1.0 \times \cos\theta}{780 \times 10^{-6}}\right)\end{array}\right\}$$
$$\cong 0.157 \times \{1.00 + 0.07\cos(2.4 \times 10^{-4} \cos\theta)\}$$

In Equation (5), cos ranges from −1 to 1, so that It ranges from 0.157×0.93 (=0.146) to 0.157×1.07 (=0.168). In other words, when the input current to the VCSEL 1A is changed, the light output is changed, resulting in changing the wavelength λ and the refractive index n (also, θ). Consequently, the transmittance of the ND filter 4 is changed in a range from 0.146 to 0.168 depending on the light output from the VCSEL.

To further reduce the transmittance variation of about 0.022, $r_1'$ or $r_2'$ may further be reduced. In the first example, $r_2'$ is set to 0.07, which is an extremely small value, to reduce the transmittance variation to about 0.022. However, if the dielectric film is not applied onto the surface on the polygon mirror side, the amplitude reflectance is increased by about 0.2, resulting in increasing the transmittance variation.

As described in the first example, because the laser cavity length (or the suppression ratio) of the VCSEL 1A and the reflectance of the ND filter 4 have a close relationship, both of them need to be optimized simultaneously.

Figure 26:
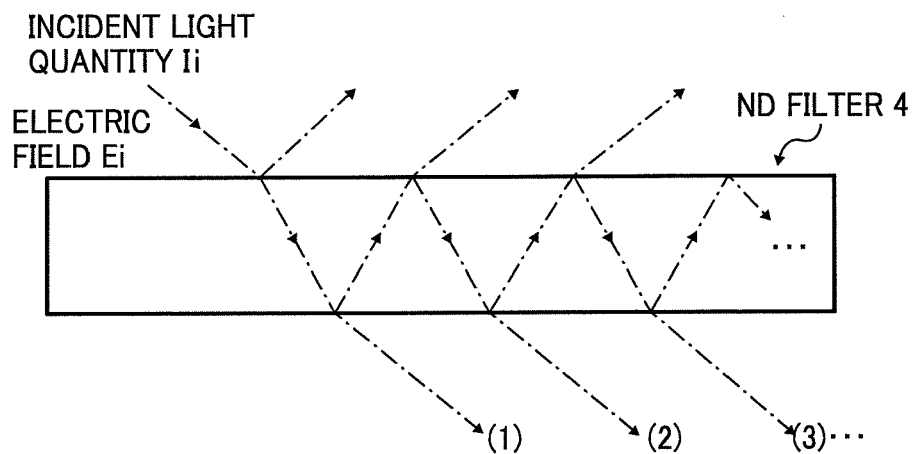
FIG. 26 is a diagram for explaining the light interference in the ND filter.
Figure 27:
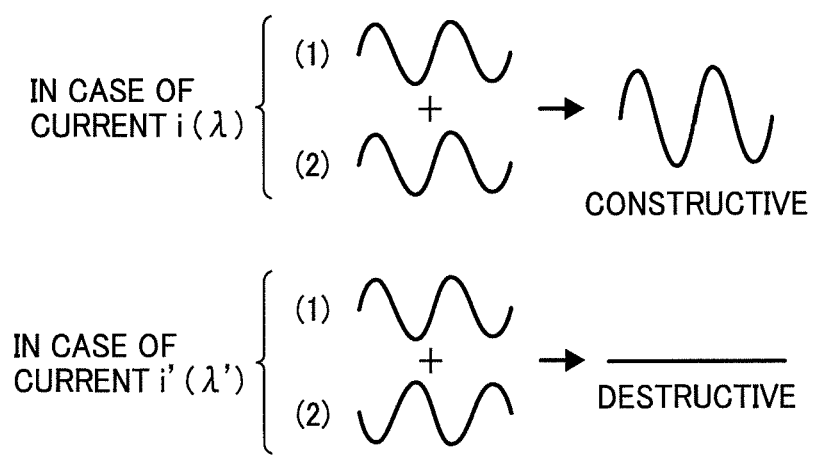
FIG. 27 is a diagram for explaining a phenomenon in which a state of interference in the ND filter is changed depending on input current to a VCSEL.

In FIG. 26, when a laser beam passes through the ND filter 4, a part of the laser beam is reflected by the metal film surface. When laser beams reflected an even number of times within the ND filter 4 ((2), (3), . . . in the figure) interfere with the transmitted light (1) passed through the ND filter, a non-negligible difference is generated between the transmitted light quantity from the ND filter at this time and that at the time the interference does not occur.

Whether the laser beams undergo constructive interference or destructive interference according to the interference between the transmitted light and the internally reflected light depends on the wavelengths λ of the laser beams. Because the wavelengths λ are changed along with change in the input current i to the VCSEL 1A, an interference state is changed depending on the input current i (see FIG. 27). This is a cause of the "transmittance waviness phenomenon" in which the transmittance of the ND filter 4 is changed depending on the input current i to the VCSEL 1A.

Example 2

The second example is configured in the same manner as the optical scanning device of the first example (see FIG. 20), and is different from the first example only in that the thickness d of the glass substrate of the ND filter 4 is changed.

$$0 < \left|4\pi d\left\{\left(\frac{n}{\lambda} - \frac{n'}{\lambda'}\right)\cdot\cos\theta\right\}\right| < \frac{\pi}{2} \quad (6)$$

When Inequality (6) is solved, the term in cos of Equation for It ranges from 0 to 1. Accordingly, the transmittance variation of the ND filter 4 ranges from 0.157×1.0 to 0.157× 1.07, which is reduced to half of that of the first example.

More specifically, on condition that the wavelength of the output from the VCSEL 1A is 780 nm and the refractive index of the glass substrate is 1.5, it is assumed that the input current to the VCSEL 1A is increased about three times and the wavelength of 780.5 nm and the glass-substrate refractive index of 1.5011 are obtained. Herein, θ is treated as a constant because its contribution is small. Herein, α is 10°, so that θ becomes 6.7°. As a result of the calculation according to the above parameters, d=0.71 mm.

Figure 28:
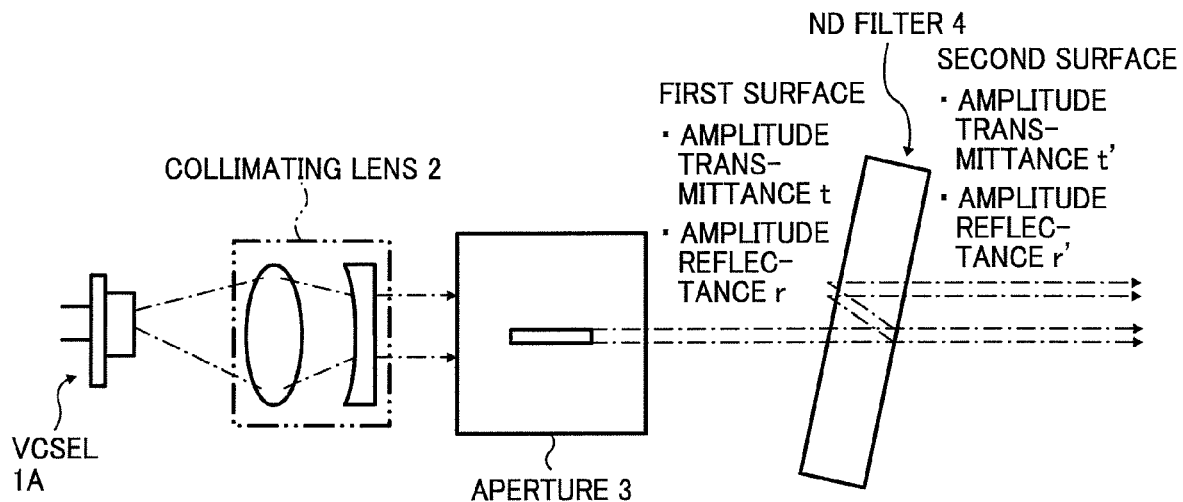
FIG. 28 is a diagram illustrating a configuration and action of a main optical system of an optical scanning device according to a second example.

With reference to FIG. 28, the ND filter 4 in which the thickness is made thin enough to prevent occurrence of "transmittance waviness" (the thickness is monotonically increased or decreased) will be described. In the figure, t and r respectively represent the amplitude transmittance and the amplitude reflectance of the first surface of the ND filter 4, and t' and r' respectively represent the amplitude transmittance and the amplitude reflectance of the second surface of the ND filter 4. Furthermore, when d represents the thickness of the ND filter 4 and α represents an angle between a moving direction of a principal ray of the laser beams input to the ND filter 4 and a normal of the surface on the VCSEL 1A (light source) side of the ND filter 4 (see FIG. 25), Expression (7) (an approximation of "a calculation formula of the transmittance waviness") made by the inventors of the present invention can be solved.

$$(tt')^2\{1 + (rr')^2 + 2rr'\}\cdot\cos\left(\frac{4\pi n d \cos\alpha}{\lambda}\right) \quad (7)$$

In Expression (7), if a parameter of cos is equal to or smaller than π/2 between arbitrary outputs from the VCSEL, the "transmittance waviness" of the ND filter 4 simply corresponds to "monotonic increase or decrease", so that the light quantity difference between light-emitting points is reduced to half of a sine-wave-like transmittance waviness. In other words, as d in the term of cos of Expression (7) is made smaller, a term multiplied by cos in the Expression is less changed, which means that the transmittance waviness does not occur.

When the parameter of cos in Expression (7) is solved from this view point, the following Inequality (8) is obtained.

$$d < \frac{1}{8\cdot\left|\left(\frac{n}{\lambda} - \frac{n'}{\lambda'}\right)\cdot\cos\alpha\right|} \quad (8)$$

In Inequality 8, d is the thickness of the ND filter 4, and n, n', λ, λ' are parameters at the time a laser beam from arbitrary one light-emitting point of the VCSEL 1A having a plurality of light-emitting points passes trough the ND filter 4. That is, λ is a wavelength of an arbitrary light output, n is a refractive index of the ND filter 4 with this light output, λ' is a wavelength of another light output, and n' is a refractive index of the ND filter 4 with this light output. Furthermore, θ is a value calculated by the following Equation (9) according to Snell's law when α represents an angle between the moving direction of the principal ray of the laser beams input to the ND filter 4 and a normal line of the surface on the VCSEL 1A (light source) side of the ND filter 4.

$$\sin \alpha = n \sin \theta \qquad (9)$$

The conditional expression described as Inequality (8) is a modification of Expression (7). Specifically, in the conditional expression, the term in the parameter of cos of Expression (7) becomes equal to or smaller than π/2 and the term of cos is changed only by a ¼ cycle, which indicates the monotonic increase. As described above, because the transmittance waviness increases (or decreases) monotonically instead of being the sine wave shape, a transmittance difference between the light-emitting points can be reduced to half of the transmittance waviness in the sine wave shape.

Figure 29:
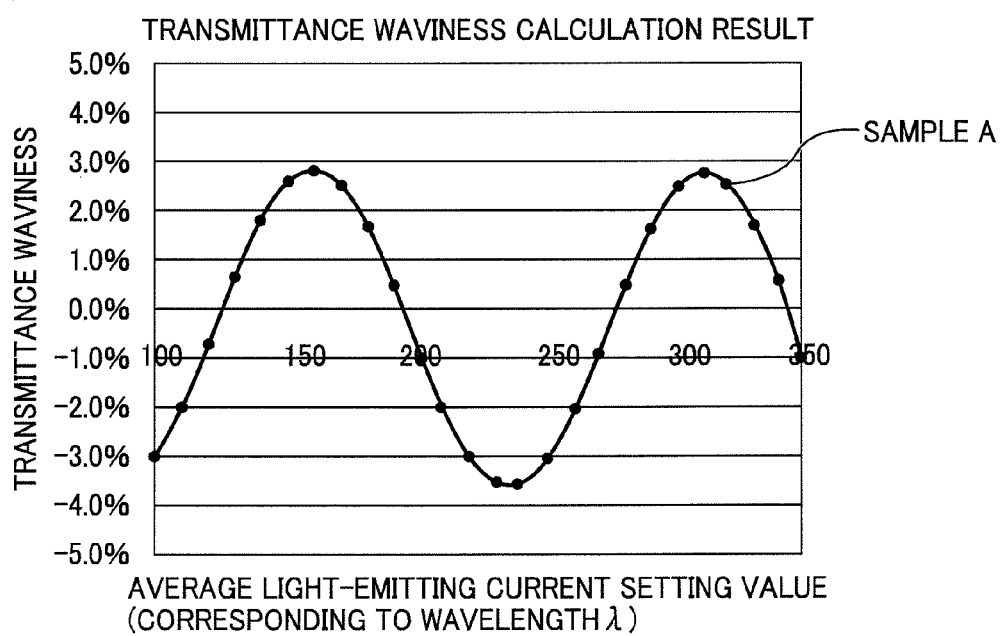
FIG. 29 is a graph illustrating an example of a transmittance waviness calculation result.

For example, in FIG. 29, an example is illustrated in which variation of a line of a sample A is limited in a range from 120 to 150 when an average light-emitting current setting value corresponding to the wavelength λ is plotted on the horizontal axis and a ratio (%) of the "transmittance waviness" is plotted on the vertical axis.

In the figure, the following evaluation method is used. That is, on condition that the average light-emitting current setting value to the VCSEL 1A is increased from 100 to 350 every 10 pitches, i.e., the initial value of the input current is increased 3.5 times every one-tenth pitch, the transmitted light quantity from the ND filter is measured at each current value in both a situation with the ND filter 4 and a situation without the ND filter 4. Herein, (the light quantity with the ND filter)/(the light quantity without the ND filter)–(a transmittance average) is evaluated as the transmittance waviness of the ND filter. The transmittance average in this expression is an average of (the light quantity with the ND filter)/(the light quantity without the ND filter).

The following is the list of the literatures that have been referred to for the descriptions in the first and the second examples.

The Basics of Basics of Lasers, The Optronics Co., Ltd, the first edition, pp. 44 to pp. 45.

Understanding Fundamentals and Applications of Semiconductor Lasers, CQ Publishing Co., Ltd., the fourth edition, pp. 93 to pp. 94, and pp. 193.

Handbook of Application of Light Electronics, SHOKODO Co., Ltd., pp. 93 to pp. 95.

Photonics, Ohmsha, Ltd., pp. 241 to pp. 250.

Surface Emitting Laser, Ohmsha, Ltd., pp. 29 to pp. 30.

According to the present invention, an optical scanning device, an image forming apparatus, and an optical communication system that are novel and able to solve the above-mentioned problems are provided. A main advantage of the present invention is as follows.

That is, according to the present invention, because of the above-mentioned configuration, the multiple interference can be prevented when a vertical-cavity surface-emitting laser light source that emits a laser beam perpendicular to a top surface thereof is used. Therefore, variation in the light use efficiency can be reduced, optical scanning at high speed and with high density can be performed while an inadequate light output range of the light source can be compensated for, and desired image formation can be performed.

Furthermore, according to the present invention, because of the above-mentioned configuration, the longitudinal hopping can be prevented and variation in the beam spot size and the beam spot diameter can be prevented.

Moreover, according to the present invention, because of the above-mentioned configuration, the single mode characteristics is increased, so that the longitudinal hopping can be prevented and variation in the beam spot size and the beam spot diameter can be prevented.

Furthermore, according to the present invention, because of the above-mentioned configuration, a light quantity difference between the light-emitting points of the VCSEL can be prevented.

Moreover, according to the present invention, because of the above-mentioned configuration, it is possible to prevent unexpected exposure by ghost light.

Furthermore, according to the present invention, because of the above-mentioned configuration, when a vertical-cavity surface-emitting laser light source that emits a laser beam perpendicular to a top surface thereof is used in the optical communication system, inclusion of the multiple interference light, which conventionally occurs, can be prevented. Consequently, a linear relationship between the light output variation of the vertical-cavity surface-emitting laser and the transmitted light quantity from the light-quantity adjusting element can be ensured. As a result, desired optical communication can be performed at high speed.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An optical scanning device comprising:
   a vertical-cavity surface-emitting laser light source that emits laser beams perpendicular to a top surface thereof;
   a first optical system that couples the laser beams from the light source;
   a deflecting unit that deflects the laser beams;
   a second optical system that guides the laser beams from the first optical system to the deflecting unit;
   a third optical system that focuses the laser beams deflected by the deflecting unit into an optical spot on a scanned surface; and
   a light-quantity adjusting element disposed between the light source and the deflecting unit and having a substrate formed of a first surface and a second surface,
   wherein the first surface of the light-quantity adjusting element is coated with neutral density coating and the second surface of the light-quantity adjusting element is coated with antireflection coating so that reflectance of the second surface is made smaller than reflectance of the first surface, and
   wherein the vertical-cavity surface-emitting laser light source and the first optical system are configured such that the light-quantity adjusting element is disposed on an optical path of a divergent beam, with the divergent beam being incident on the neutral density coating of the light-quantity adjusting element, such that at least some diverging rays of the divergent beam have different optical path lengths within the light-quantity adjusting element, between the first surface and the second surface.

2. The optical scanning device according to claim 1, wherein the laser beam from the first optical system is a divergent beam, and the light-quantity adjusting element is disposed between the first optical system and the second optical system.

3. The optical scanning device according to claim 1, wherein longitudinal mode hopping does not occur in the vertical-cavity surface-emitting laser even when light output is increased or decreased.

4. The optical scanning device according to claim 1, wherein a cavity length of the vertical-cavity surface-emitting laser is equal to or shorter than 10 µm.

5. The optical scanning device according to claim 1, wherein the vertical-cavity surface-emitting laser is emitted from a plurality of light-emitting points so that the following Expression is satisfied:

$$d < \frac{1}{8 \cdot \left| \left( \frac{n}{\lambda} - \frac{n'}{\lambda'} \right) \cdot \cos\theta \right|}$$

(1) where d represents a thickness of the light-quantity adjusting element; n, n', λ, λ' are parameters at the time a laser beam from arbitrary one light-emitting point of the vertical-cavity surface-emitting laser having the plurality of light-emitting points passes through the light-quantity adjusting element such that λ is a wavelength of an arbitrary light output, n is a refractive index of the light-quantity adjusting element with the arbitrary light output, λ' is a wavelength of another light output, and n' is a refractive index of the light-quantity adjusting element with the other light output; and θ is a value calculated by the following Expression according to Snell's law: sin α=n sin θ, and (2) where α represents an angle between the moving direction of the principal ray of the laser beams input to the light-quantity adjusting element and a normal line of the surface on the light source side of the light-quantity adjusting element.

6. An image forming apparatus comprising the optical scanning device according to claim 1.

7. The optical scanning device of claim 1, wherein said neutral density coating of said light-quantity adjusting element is located on an optical path of said laser beams between (1) said vertical-cavity surface-emitting laser light source and (2) said antireflection coating of said light-quantity adjusting element.

8. The optical scanning device of claim 7, wherein said vertical-cavity surface-emitting laser includes a plurality of independently-modulatable light-emitting points, such that the optical scanning device generates a plurality of scanning lines simultaneously by one scanning.

9. The optical scanning device of claim 1, wherein the divergent beam is incident on the neutral density coating of the light-quantity adjusting element to thereby reduce interference compared to the case where the light-quantity adjusting element is disposed on an optical path of a parallel beam.

10. The optical scanning device of claim 1, wherein the divergent beam is incident on the neutral density coating of the light-quantity adjusting element to thereby prevent interference.

* * * * *